US012796102B2

(12) United States Patent
Kang et al.

(10) Patent No.: US 12,796,102 B2
(45) Date of Patent: Nov. 10, 2026

(54) SEMICONDUCTOR DEVICE

(71) Applicant: SAMSUNG ELECTRONICS CO., LTD., Suwon-si (KR)

(72) Inventors: Byungju Kang, Seongnam-si (KR); Raheel Azmat, Suwon-si (KR); Jiwook Kwon, Hwaseong-si (KR); Suhyeon Kim, Hwaseong-si (KR); Kwanyoung Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 775 days.

(21) Appl. No.: 17/751,093

(22) Filed: May 23, 2022

(65) Prior Publication Data

US 2023/0068716 A1 Mar. 2, 2023

(30) Foreign Application Priority Data

Aug. 27, 2021 (KR) ........................ 10-2021-0113699

(51) Int. Cl.
*H10D 89/10* (2025.01)
*G06F 30/392* (2020.01)
(Continued)

(52) U.S. Cl.
CPC ........... *H10D 89/10* (2025.01); *G06F 30/392* (2020.01); *G06F 30/394* (2020.01); (Continued)

(58) Field of Classification Search
CPC . H10D 84/981; H10D 84/975; H01L 23/5286
See application file for complete search history.

(56) References Cited

U.S. PATENT DOCUMENTS 8,901,738 B2 12/2014 Gambino et al.
10,366,954 B1 7/2019 Kim et al.
(Continued)

FOREIGN PATENT DOCUMENTS

KR 10-2019-0076707 A 7/2019
KR 10-2021-0053651 A 5/2021

OTHER PUBLICATIONS

Communication issued on Jul. 25, 2025 by the Korean Intellectual Property Office for Korean Patent Application No. 10-2021-0113699.

*Primary Examiner* — Mounir S Amer
*Assistant Examiner* — Alexander Belousov
(74) *Attorney, Agent, or Firm* — Sughrue Mion, PLLC

(57) ABSTRACT

A semiconductor device includes: a standard cell including a plurality of active patterns extending in a first direction, a gate structure intersecting the plurality of active patterns and extending in a second direction, and source/drain regions respectively provided on the plurality of active patterns positioned on both sides of the gate structure; a plurality of signal lines extending on the standard cell in the first direction, arranged in the second direction, and electrically connected to the standard cell; and first and second power straps extending on the standard cell in the first direction, electrically connected to some of the source/drain regions, and supplying power to the standard cell, wherein each of the first and second power straps is provided on the standard cell while provided on the same line as any one of the plurality of signal lines in the first direction.

19 Claims, 19 Drawing Sheets

50A

(51) Int. Cl.
*G06F 30/394* (2020.01)
*H10D 84/90* (2025.01)
*H10W 20/42* (2026.01)
*H10W 20/43* (2026.01)

(52) U.S. Cl.
CPC .......... *H10D 84/907* (2025.01); *H10W 20/42* (2026.01); *H10W 20/43* (2026.01); *H10D 84/975* (2025.01); *H10D 84/981* (2025.01)

(56) References Cited

U.S. PATENT DOCUMENTS

| | | | | |
|---|---|---|---|---|
| 10,510,774 | B2 | 12/2019 | Debacker et al. | |
| 10,515,178 | B2 | 12/2019 | Biswas et al. | |
| 2009/0033368 | A1 | 2/2009 | Pitts | |
| 2018/0151496 | A1 | 5/2018 | Biswas et al. | |
| 2018/0151567 | A1 | 5/2018 | Lin et al. | |
| 2018/0294226 | A1* | 10/2018 | Lee | G06F 30/327 |
| 2019/0295605 | A1 | 9/2019 | Nishizaki | |
| 2019/0355749 | A1 | 11/2019 | Do et al. | |
| 2019/0385999 | A1 | 12/2019 | Berzins et al. | |
| 2020/0104451 | A1 | 4/2020 | Huang et al. | |
| 2021/0134837 | A1 | 5/2021 | You et al. | |
| 2022/0237359 | A1* | 7/2022 | Peng | G06F 30/398 |

* cited by examiner

SEMICONDUCTOR DEVICE

CROSS-REFERENCE TO RELATED APPLICATION(S)

This application is based on and claims priority under 35 USC 119(a) of Korean Patent Application No. 10-2021-0113699 filed on Aug. 27, 2021 in the Korean Intellectual Property Office, the entire inventive concept of which is incorporated herein by reference for all purposes.

BACKGROUND

1. Field

The disclosure relates to a semiconductor device.

2. Description of Related Art

In accordance with increasing demand for a semiconductor device having high performance, high speed and/or multifunctionality, the semiconductor device may have increased integration. As such, in order to provide semiconductor devices, which are highly integrated, research is being actively conducted for a layout design thereof to have increased freedom and integration.

SUMMARY

Example embodiments provide a semiconductor device having improved integration.

According to an aspect of the disclosure, there is provided a semiconductor device including: a standard cell including: a plurality of active patterns extending in a first direction, the plurality of active patterns being spaced apart from each other in a second direction intersecting the first direction, a gate structure intersecting the plurality of active patterns and extending in the second direction, and source/drain regions respectively provided on the plurality of active patterns on both sides of the gate structure; a plurality of signal lines extending on the standard cell in the first direction, and electrically connected to the standard cell; and a first power strap and a second power strap extending on the standard cell in the first direction, each of the first power strap and the second power strap electrically connected to one or more of the source/drain regions, the first power strap and the second power strap configured to supply power to the standard cell, wherein each of the first power strap and the second power strap is provided on a same row as one of the plurality of signal lines.

According to an aspect of the disclosure, there is provided a semiconductor device including: a standard cell including: a plurality of active patterns extending in a first direction, the plurality of active patterns being spaced apart from each other in a second direction, intersecting the first direction, a gate structure intersecting the plurality of active patterns and extending in the second direction, source/drain regions respectively provided on the plurality of active patterns on both sides of the gate structure, and a plurality of contact structures, each formed on one the source/drain regions in a third direction, perpendicular to the first and second directions; a plurality of first signal lines extending on a first level on the standard cell in the first direction, the plurality of first signal lines being arranged in the second direction, and the plurality of first signal lines being electrically connected to the standard cell; first and second power lines extending on the first level on the standard cell in the first direction, the first and second power lines being connected to the one or more of plurality of contact structures, and the first and second power lines being arranged parallel to the plurality of first signal lines; a plurality of second signal lines extending on a second level, higher than the first level, on the standard cell in the second direction, and the plurality of second signal lines being arranged in the first direction, one or more of the plurality of second signal lines including first and second power supply lines respectively connected to the first and second power lines; a plurality of third signal lines extending on a third level, higher than the second level, on the standard cell in the first direction, and the plurality of third signal lines being arranged in the second direction; and a first power strap and a second power strap extending on the third level on the standard cell in the first direction, respectively connected to the first and second power supply lines, and each arranged on a same row as one of the plurality of third signal lines, while spaced from each other in the first direction.

According to an aspect of the disclosure, there is provided a semiconductor device including: a standard cell including: a plurality of active patterns extending in a first direction, the plurality of active patterns being spaced apart from each other in a second direction, intersecting the first direction, a gate structure intersecting the plurality of active patterns and extending in the second direction, and source/drain regions respectively provided on the plurality of active patterns on both sides of the gate structure; a plurality of signal lines extending on the standard cell in the first direction, and arranged at a first pitch in the second direction; a first power strap extending on a first boundary of the standard cell in the first direction, supplying power to the standard cell, and provided on a same row as a first signal line among the plurality of signal lines; and a second power strap offset from a second boundary opposite to the first boundary, extending in the standard cell in the first direction, supplying the power to the standard cell, and provided on a same row as a second signal line among the plurality of signal lines in the first direction.

According to an aspect of the disclosure, there is provided a semiconductor device including: a plurality of active patterns extending in a first direction, the plurality of active patterns being spaced apart from each other in a second direction different from the first direction; a gate structure intersecting the plurality of active patterns and extending in the second direction, and a source region provided a first side of the gate structure and a drain region provided on a second side of the gate structure; a plurality of signal lines extending in the first direction; a first power strap extending in the first direction on a same row as a first signal line, among the plurality of signal lines, the first power strap electrically connected to one of the source region or the drain region.

Various advantages and effects of the disclosure are not limited to the description above, and may be more easily understood in the description of the example embodiments.

BRIEF DESCRIPTION OF DRAWINGS

The above and other aspects, features, and advantages of the disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
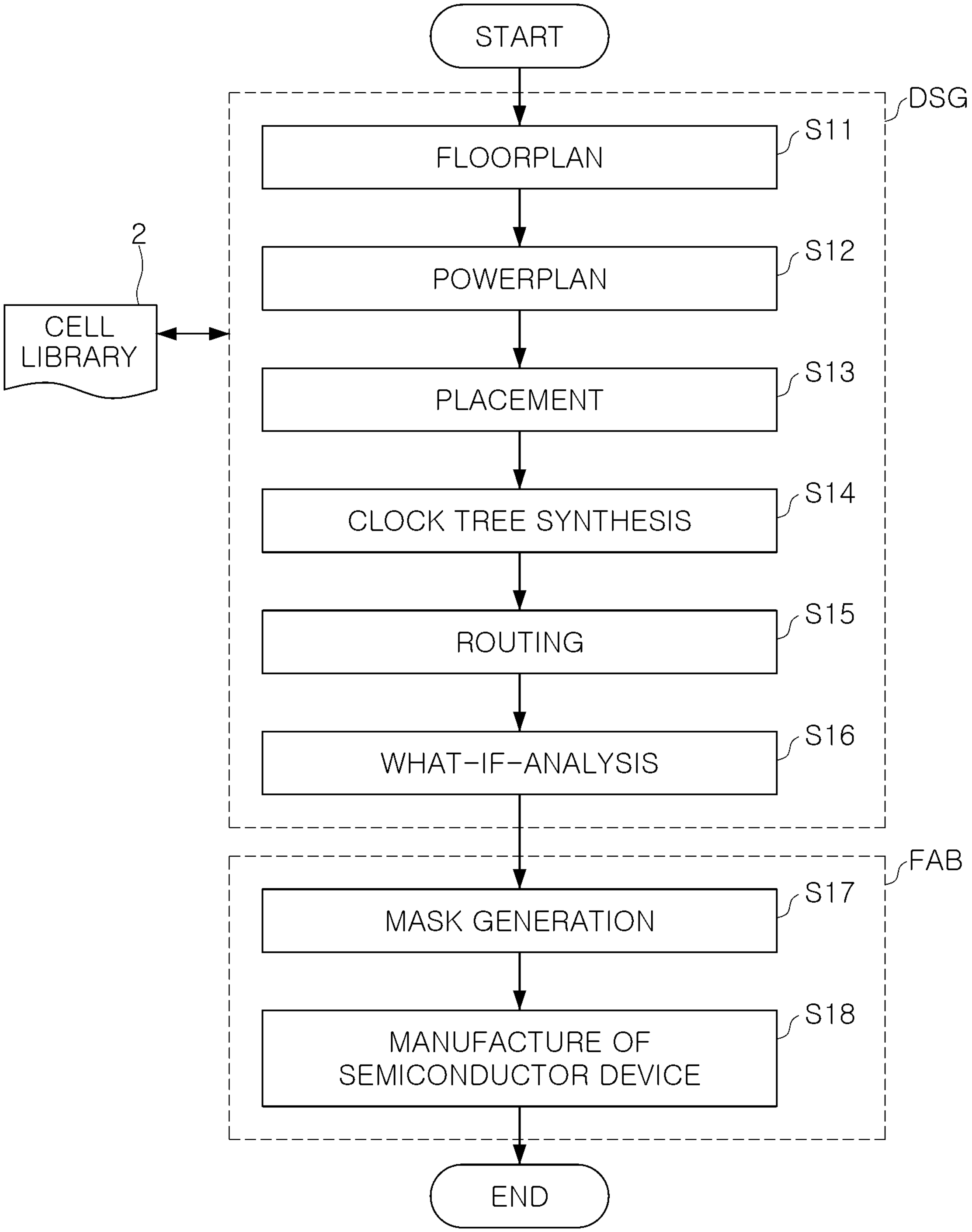
FIG. 1 is a flowchart illustrating a method of designing and manufacturing a semiconductor device according to an example embodiment of the disclosure.
Figure 2:
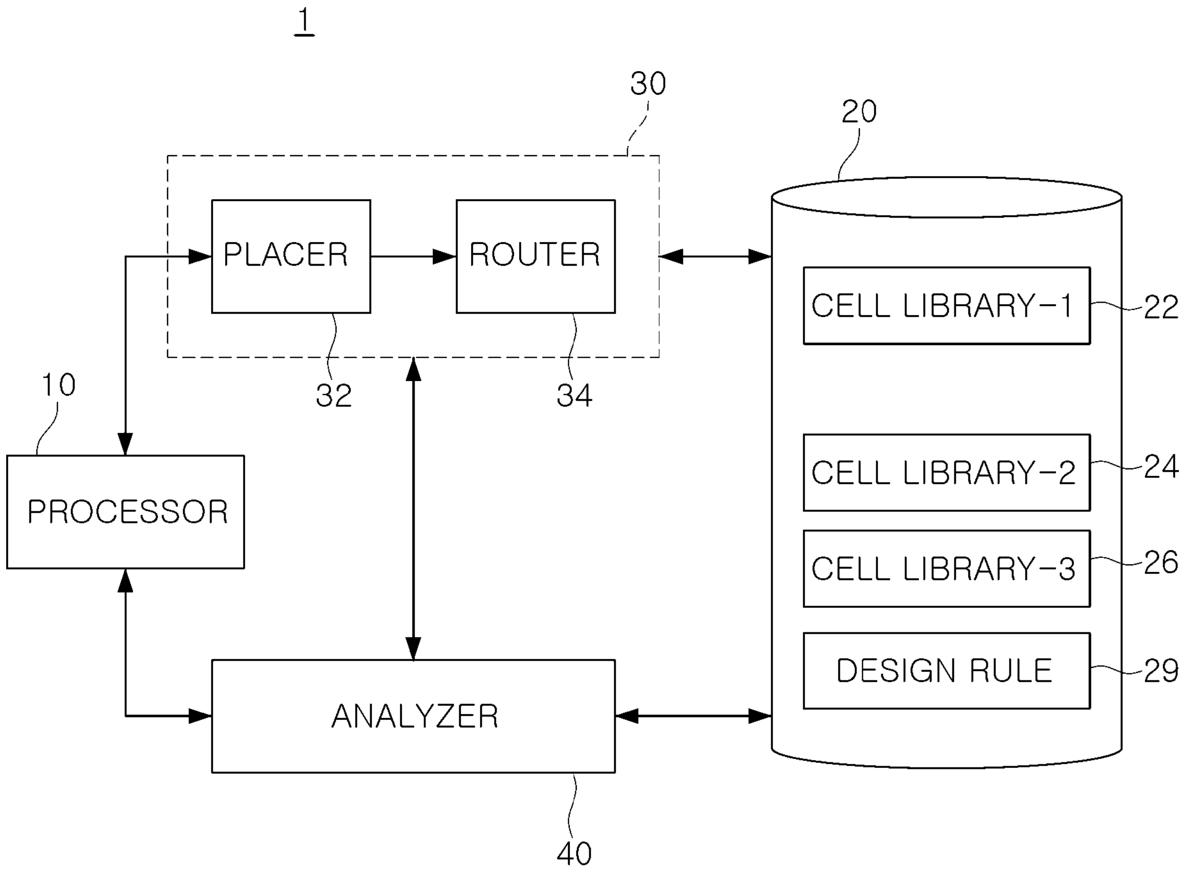
FIG. 2 is a block diagram illustrating a design system of the semiconductor device according to an example embodiment of the disclosure.

FIG. 1 is a flowchart illustrating a method of designing and manufacturing a semiconductor device according to an example embodiment of the disclosure; and FIG. 2 is a block diagram illustrating a design system of the semiconductor device according to an example embodiment of the disclosure.

Referring to FIG. 1, the method of designing and manufacturing a semiconductor device may include designing (DSG) a semiconductor device and manufacturing (FAB) the semiconductor device. The designing (DSG) of the semiconductor device may be a process of designing a layout for a circuit, and performed by a design system 1 described with reference to FIG. 2. The design system 1 may include a program including a plurality of instructions executed by a processor. Accordingly, the designing (DSG) of the semiconductor device may be a process of implementing design of a circuit by using a computer. The manufacturing (FAB) of the semiconductor device may be a process of manufacturing the semiconductor device based on the designed layout, and performed by a semiconductor process module. For instance, the process of manufacturing may be referred to a semiconductor fabrication process.

The designing (DSG) of the semiconductor device may include designing a floorplan (S11), designing a powerplan (S12), designing a placement (S13), and designing a clock tree synthesis (CTS, S14), designing a routing (S15), and designing a what-if-analysis (S16).

The designing of the floorplan (S11) may be a process of physically designing a logically-designed schematic circuit by cutting and moving the circuit. In the designing of the floorplan (S11), a memory or a circuit functional block may be provided. In this process, for example, the circuit functional blocks to be provided adjacent to each other may be identified from each other, and a space for the circuit functional block may be allocated in consideration of an available space, a required performance, etc. For example, the designing of the floorplan (S11) may include generating a site-row and forming a routing track in the generated site-row. The site-row may be a frame for arranging standard cells stored in a cell library 2 based on a prescribed design rule. The routing track may provide a virtual line on which a wiring is formed. In particular, in example embodiments, the standard cells provided from the plurality of cell libraries may be arranged in each circuit functional block.

Accordingly, the routing track may include a plurality of routing tracks each having a different default width value for each cell library. Lower wirings in the standard cells, having different pitches, may be provided in the routing track in the subsequent designing of the placement (S13). The lower wirings in the different standard cells may have widths the same as or different from each other. In addition, upper wirings having different pitches may be provided in the routing track in the subsequent designing of the routing (S15).

The designing of the powerplan (S12) may be a process of providing a pattern (e.g., power rail) of the wiring that supply local power to the provided circuit functional block. According to an example embodiment, the pattern of the wiring that supply local power may be a driving voltage or a reference voltage (or ground). For example, the pattern of the wiring that connects the power or the ground to the circuit functional block may be generated for the power to be uniformly supplied to the entire semiconductor device in a net shape. In this process, the above pattern may be generated by the net shape by using various rules. In particular, an example embodiment may use a power strap provided on the same layer as a signal line while being parallel thereto, instead of the power rail having a relatively large width, i.e. pattern supplying the power. Accordingly, the signal lines may have improved integration and design freedom even under a limited condition of the same pitch between the signal lines. According to an example embodiment, the signal lines may be provided on a plurality of rows, each row including one of the signal lines.

The designing of the placement (S13) may be a process of providing the pattern of an element included in the circuit functional block, and may include a process of arranging the standard cells. In particular, in example embodiments, each standard cell may include the semiconductor element and lower wiring lines of at least one layer, connected thereto. Hereinafter, the "layer" may indicate patterns provided on the same height level as each other while having the same thickness as each other. The lower wiring lines may include a "power line" connecting a power source or ground to the circuit functional block and the "signal line" transmitting a control signal, an input signal or an output signal. In this process, an empty region may occur between the arranged standard cells, and the empty region may be filled by a filler cell (see FIG. 3). The filler cell may be a dummy region unlike the standard cell including the operable semiconductor element and a unit circuit implemented by having the semiconductor elements. The shape or size of a pattern configuring a transistor and the wiring to be actually formed on a silicon substrate may be defined in this process. For example, layout patterns such as a P-channel metal-oxide-semiconductor (PMOS), a N-channel metal-oxide-semiconductor (NMOS), an n-well, a gate electrode, and the wirings to be provided on these components may be appropriately arranged to form an inverter circuit on the actual silicon substrate.

The designing of the clock tree synthesis CTS (S14) may be a process of generating patterns of signal lines of a central clock related to a response time that determines a performance of the semiconductor device. Subsequently, the designing of the routing (S15) may be a process of generating an upper wiring structure including the upper wirings of an upper layer, connecting the arranged standard cells to each other. The upper wirings may be electrically connected to the lower wirings in the standard cells, and the standard cells may thus be electrically connected to each other. The upper wirings may be physically formed on top of the lower wirings.

The designing of the what-if-analysis (S16) may be a process of verifying and correcting the generated layout. Items to be verified may include a design rule check (DRC) verifying whether the layout is properly aligned based on the design rule, an electronical rule check (ERC) verifying whether the layout is properly done without electrical breakage occurring in the semiconductor device, a layout versus schematic (LVS) verifying whether the layout matches a gate-level netlist, etc.

The manufacturing (FAB) of the semiconductor device may include manufacturing a mask (S17) and manufacturing a semiconductor device (S18).

The manufacturing of the mask (S17) may include a process of manufacturing mask data for forming various patterns on the plurality of layers by performing optical proximity correction (OPC) or the like on layout data generated in the designing (DSG) of the semiconductor device and a process of manufacturing the mask using the mask data. The optical proximity correction (OPC) may be performed to correct distortion that may occur in a photolithography process. The mask may be manufactured in a manner in which the layout patterns are depicted using a thin film of chrome, applied on a glass or quartz substrate.

In the manufacturing of the semiconductor device (S18), various types of exposure and etching processes may be repeatedly performed. Shapes of the patterns generated when designing the layout design may be sequentially formed on the silicon substrate in these processes. In detail, various semiconductor processes may be performed on a semiconductor substrate such as a wafer by using the plurality of masks to form the semiconductor device in which an integrated circuit is implemented. The manufacturing of the semiconductor device may include a deposition process, an etching process, an ion (implantation?) process, a cleaning process, etc. The manufacturing of the semiconductor device may also include a packaging process of mounting the semiconductor device on a PCB and sealing the same by using a sealing material, and may also include a test process of testing the semiconductor device or its package.

FIG. 2 is a block diagram illustrating a design system of the semiconductor device according to example embodiments.

Referring to FIG. 2, the design system 1 may include a processor 10, a storage device 20, a designer 30 and an analyzer 40. The design system 1 may perform at least a portion of the design operation of the semiconductor device, described in the designing (DSG) of the semiconductor device with reference to FIG. 1. The design system 1 may be implemented as an integrated device, and may thus be referred to as a design device. The design system 1 may be a dedicated device for designing the integrated circuit of the semiconductor device, and may also be a computer for running various simulation tools or design tools.

The processor 10 may be used by the designer 30 and/or the analyzer 40 to perform a calculation. For example, the processor 10 may include a micro-processor, an application processor (AP), a digital signal processor (DSP), a graphic processing unit (GPU), etc. Although FIG. 2 shows only one processor 10, the design system 1 may include the plurality of processors according to example embodiments. The processor 10 may include a cache memory to enhance its calculation capability.

The storage device 20 may store a first standard cell library 22, a second standard cell library 24, and a third standard cell library 26, and may further store a design rule 29. The first standard cell library 22, the second standard cell library 24, and the third standard cell library 26 and the design rule 29 may be provided from the storage device 20 to the designer 30 and/or the analyzer 40. The first standard cell library 22, the second standard cell library 24, and the third standard cell library 26 may include the standard cells having cell heights, cell sizes, circuit specifications, circuit configurations, and routing track widths, different from each other. According to example embodiments, the number of standard cell libraries included in the storage device 20 may be variously changed.

The designer 30 may include a placer 32 and a router 34. According to an example embodiment, the designer 30 may be referred to as a design module and the analyzer 40 may be referred to as an analyzer module. The term "module" may refer to software, hardware such as a field programmable gate array (FPGA) or application specific integrated circuit (ASIC), or a combination of the software and the hardware. For example, the "module" may be the software stored in an addressable storage medium, and may be executed by one or more processors. The placer 32 and router 34 may each perform the designing of the placement (S13) and the designing of the routing (S15), shown in FIG. 1. The placer 32 may provide the standard cells based on input data defining the integrated circuit and the first standard cell library 22, the second standard cell library 24, and the third standard cell library 26 by using the processor 10. In particular, the placer 32 may provide the standard cells provided from the first standard cell library 22, the second standard cell library 24, and the third standard cell library 26 n each circuit functional block. The router 34 may perform signal routing for the arrangement of the standard cells provided by the placer 32. According to example embodiments, the placer 32 and the router 34 may be implemented as individual modules separate from each other. In addition, the designer 30 may further include a component performing the designing of the CTS (S14) shown in FIG. 1 in addition to the placer 32 and the router 34.

The analyzer 40 may perform the designing of the what-if-analysis process (S16) shown in FIG. 1, and may analyze and verify results of the arrangement and the routing. When the routing is not successfully completed, the placer 32 may provide the modified arrangement and the router 34 may perform the signal routing again for the modified arrangement. When the routing is successfully completed, the router 34 may generate output data defining the integrated circuit.

According to an example embodiment, the designer 30 and/or the analyzer 40 may be implemented as hardware components, which may include electronic components such as a processor or circuit elements. According to another example embodiment, the designer 30 and/or the analyzer 40 may be implemented in the software, and may not be limited thereto. For example, when implemented in the software, the designer 30 and the analyzer 40 may be stored in the form of a code in the storage device 20, or in another storage device separated from the storage device 20.

As described above, as a pattern for a power tap applied to a standard cell, it is possible to use the power strap provided on a same row as the signal line while being parallel to the signal line, instead of the power rails each having the relatively large width in the designing (DSG) of the semiconductor device in which the design system 1 shown in FIG. 2 is used, particularly in the designing of the routing. The power strap may have a width equal to that of the signal line provided on the same row. Therefore, the density of the signal lines may be improved even under the limited pitch condition, and freedom in designing the circuit may be improved in a limited area of the standard cell.

Figure 3:
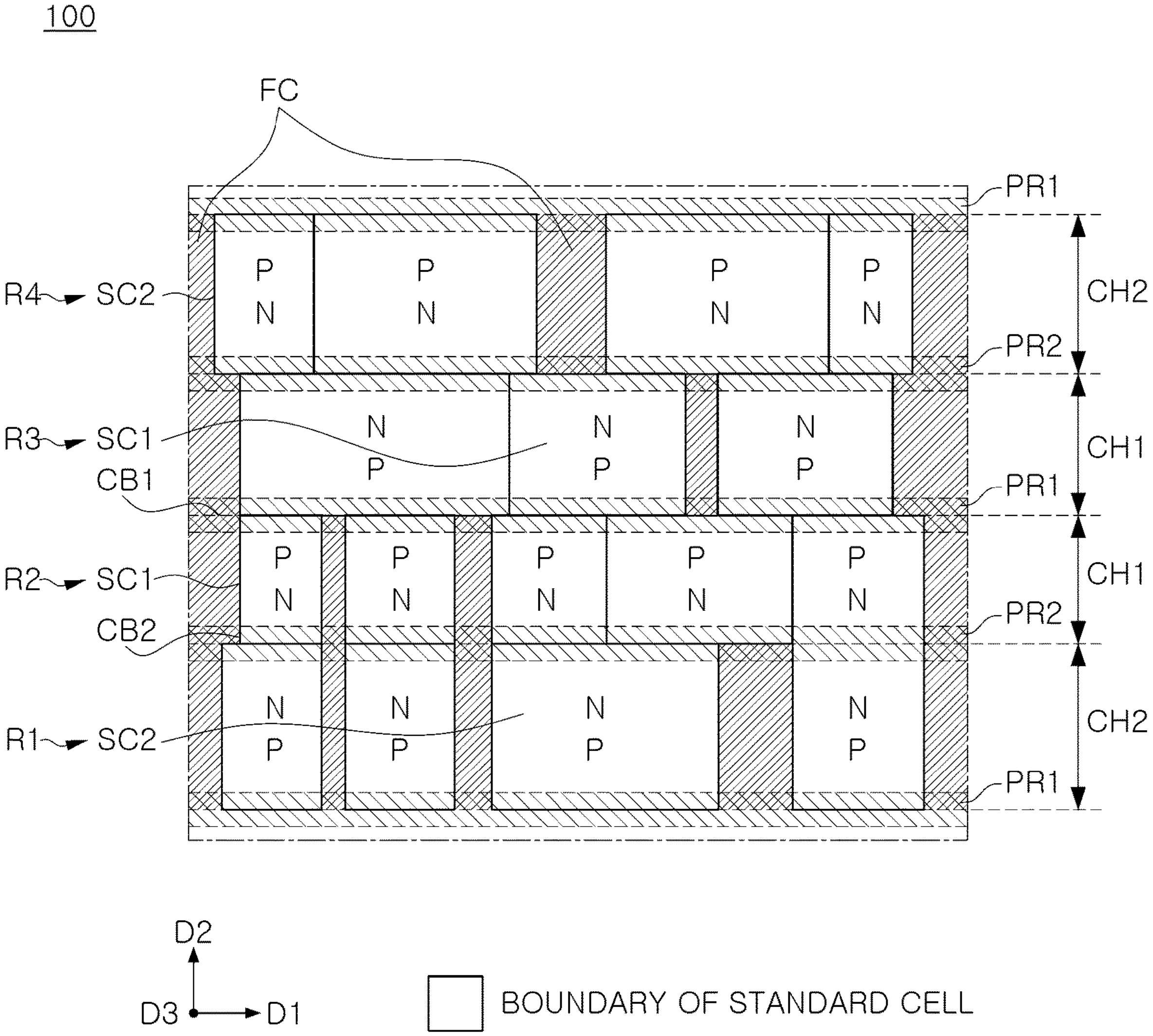
FIG. 3 is a plan view schematically illustrating the semiconductor device having a plurality of standard cells.

FIG. 3 is a plan view schematically illustrating the semiconductor device having a plurality of standard cells.

The layout of the semiconductor device shown in FIG. 3 may be understood as a plane of an actual semiconductor device manufactured based on the layout made by the standard cells designed using the method described above with reference to FIG. 1.

Referring to FIG. 3, a semiconductor device 100 according to this example embodiment may include a plurality of standard cells SC1 and SC2 and a plurality of filler cells (FC) provided as the dummy regions. The plurality of standard cells may include the first standard cells SC1 having a first cell height CH1 and the second standard cells SC1 having a second cell height CH2.

In this example embodiment, the semiconductor device 100 may include four rows R1, R2, R3 and R4, in each of which the standard cells having the same height are arranged in a first direction D1, and the four rows R1, R2, R3 and R4 may be arranged in a second direction D2 perpendicular to the first direction D1. The first standard cells SC1 arranged in the second and third rows R2 and R3, respectively, have the same first cell height CH1, and the second standard cells SC2 arranged in the first and fourth rows R1 and R4, respectively, may have the same second cell height CH2 smaller than the first cell height CH1. Meanwhile, the standard cells SC1 and SC2 provided in the same row may have different widths (in the first direction D1).

In this example embodiment, respective boundaries of the second and third rows R2 and R3, having the first cell height CH1, may be provided adjacent to each other in a column direction, that is, the second direction D2, and the first and fourth rows R1 and R4, having the second cell height CH2, may respectively be provided to be adjacent to outer boundaries of the second and third rows R2 and R3. In this example embodiment, the standard cells are described to have two cell heights. However, the standard cells may have three or more different cell heights, and the arrangement thereof may also be variously modified. For example, the second and third rows R2 and R3, having the first cell height CH1, and the first and fourth rows R1 and R4, having the second cell height CH2, may be arranged alternately with each other in the second direction D2.

The plurality of standard cells SC1 and SC2 may each have a first conductivity-type (e.g., p-type) active region and a second conductivity-type (e.g., n-type) active region, provided in the column direction, i.e. the second direction D2. The standard cells SC1 and SC2 provided in two adjacent rows among the first to fourth rows R1, R2, R3 and R4 may be provided in such a manner in which the active regions of the same conductivity type are adjacent to each other. For example, the standard cells SC1 of the second and third rows R2 and R3 may be provided in such a manner in which the p-type active regions are adjacent to each other, and the standard cells SC2 and SC1 of the first and second rows R1 and R2 and standard cells SC1' and SC2' of the third and fourth rows R3 and R4 may be arranged in such a manner in which the n-type active regions are adjacent to each other.

In general, a plurality of first power rails PR1 and a plurality of second power rails and PR2, supplying the power to the plurality of standard cells SC1 and SC2, may supply the voltage to the standard cells SC1 and SC2 provided between the plurality of first power rails PR1 and the plurality of second power rails and PR2. For example, a driving voltage VDD may be applied to the first power rail PR1, and a reference voltage VSS may be applied to the second power rail PR2. The plurality of first and second power rails PR1 and PR2 may each include a power line shared with the standard cells of two adjacent rows.

In this manner, the first and second power rails PR1 and PR2 shown in FIG. 3 may respectively be extending along the boundaries of the plurality of standard cells SC1 and SC2 in the first direction D1, and may have the relatively large width than the signal line, which may reduce a design space of the standard cells SC1 and SC2 and act as a limitation in improving the integration and design freedom of the signal line.

According to an aspect of the inventive concept, power straps are provided on the same row as the signal lines while being parallel thereto, instead of using the power rails. The power strap used in an example embodiment of the disclosure has the width equal to that of the signal line on the same row. Therefore, it is possible to not only improve the density of the signal lines even under the limited pitch condition, but also improve the freedom in designing the circuit in the limited area of the standard cell (see FIGS. 4 through 6).

Figure 4:
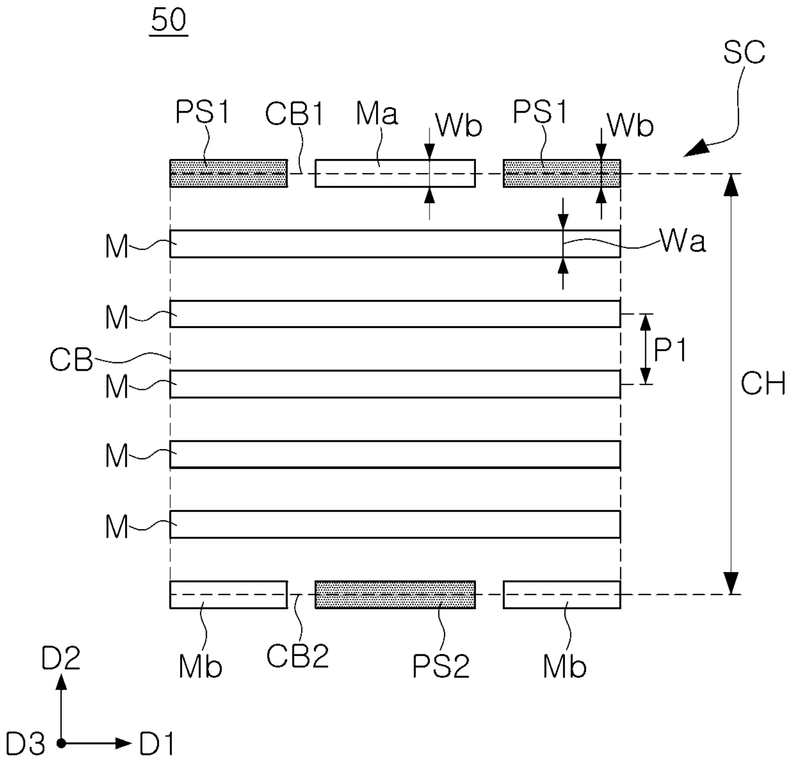
FIGS. 4 and 5 are plan views illustrating arrangements of power straps and signal lines of standard cell in the semiconductor device according to various example embodiments of the disclosure.
Figure 5:
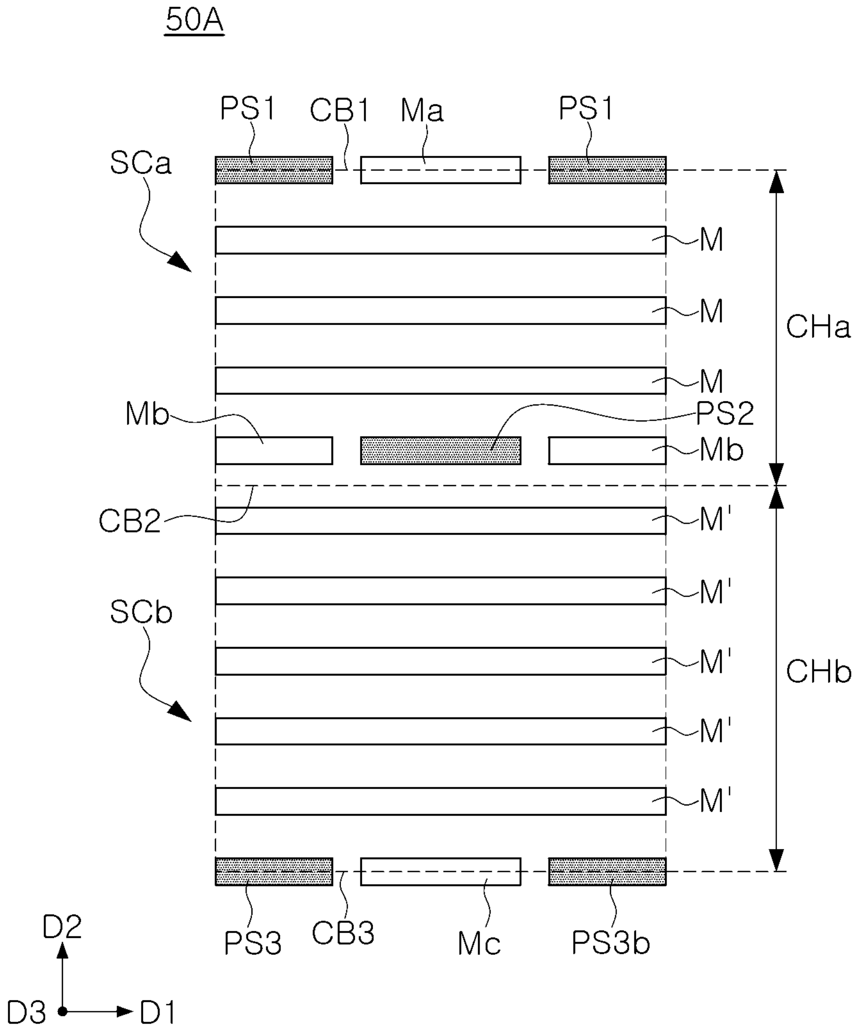

FIGS. 4 and 5 are plan views illustrating arrangements of the power straps and signal lines of standard cells according to various example embodiments of the disclosure.

Referring to FIG. 4, a semiconductor device 50 according to an example embodiment may include a standard cell SC extending in the first direction D1 and having a plurality of (e.g., seven) layers of signal lines M, Ma and Mb, arranged in the second direction D2.

In this example embodiment, the plurality of signal lines M, Ma and Mb may include two signal lines Ma and Mb respectively positioned on first and second cell boundaries CB1 and CB2 defining a cell height CH, and first and second power straps PS1 and PS2 may respectively be arranged on a same row as the two signal lines Ma and Mb in the standard cell SC, while spaced apart from each other in the first direction D1. As shown in FIG. 4, the first and second power straps PS1 and PS2 may respectively be provided on the same row as the two signal lines Ma and Mb, that is, on the first and second cell boundaries CB1 and CB2.

In this example embodiment, the first and second power straps PS1 and PS2 may respectively have the width equal to each width Wb of the two signal lines Ma and Mb, respectively. The plurality of signal lines M, Ma and Mb may be arranged by the same pitch P1 in the second direction D2, and the first and second power straps PS1 and PS2 may also be provided by the same pitch P1 as the signal line M. As described above, the first and second power straps PS1 and PS2 may be provided together with the signal line M to have a relatively thin width, thereby improving the integration of the signal lines. According to an example embodiment, signal lines M may have a width Wa, which may be same as width Wb of the two signal lines Ma and Mb and the first and second power straps PS1 and PS2. However, the disclosure is not limited thereto, and as such, width Wb may be different from width Wa in another example embodiment.

According to an example embodiment, the signal lines Ma and Mb on the same row as the first and second power straps PS1 and PS2 may be made in various patterns. As shown in FIG. 4, the first power straps PS1 may be two power straps respectively positioned on both ends of the signal line Ma on the same row. Alternatively, the signal lines Mb on the same row may be two signal lines respectively positioned on both ends of the second power strap PS2. In this manner, the first and second power straps PS1 and PS2 may each have a shape of an island to implement additional signal lines Ma and Mb on the same row, thereby improving the integration as well as design freedom of the signal lines M, Ma and Mb.

In the previous example embodiment, the first and second power straps PS1 and PS2 are exemplified to be positioned on the cell boundary. However, in another example embodiment, at least one of the first and second power straps may be offset from the cell boundary and provided in the standard cell.

Referring to FIG. 5, a semiconductor device 50A according to this example embodiment may include a first standard cell SCa and a second standard cell SCb provided parallel to each other in the second direction D2. According to an example embodiment, the first standard cell SCa and the second standard cell SCb may be provided adjacent to each other in the second direction D2. The first standard cell SCa may have a first cell height CHa, and the second standard cell SCb may have a second cell height CHb greater than the first cell height CHa. The first standard cell SCa may include five layers of first signal lines M, Ma and Mb, arranged by the same pitch, and the second standard cell SCb may include six layers of second signal lines M' and Mc.

The semiconductor device 50A may include first to third power straps PS1, PS2 and PS3, respectively positioned on the same row as signal lines Ma, Mb and Mc in the first direction D1. In this example embodiment, the first power strap PS1 may be provided on the first cell boundary CB1 of the first standard cell SCa on a same row as the signal line Ma, and similarly, the third power strap PS3 may be provided on a third cell boundary CB3 of the second standard cell SCb on a same row as the signal line Mc. The second power strap PS2 may be offset from the second cell boundary CB2 and positioned in the first standard cell SCa on a same row as the signal line Mb. The second power strap PS2 may be a power tap shared by the first and second standard cells SCa and SCb. For example, the driving voltage VDD may be applied to the first and third power straps PS1 and PS3, and the reference voltage VSS may be applied to the second power strap PS2 to drive the first and second standard cells SCa and SCb. According to an example embodiment, the first power strap PS1 may be provided adjacent to the signal line Ma in the first direction D1, the second power strap PS2 may be provided adjacent to the signal line Mb in the first direction, and the third power strap PS3 may be provided adjacent to the signal line Mc in the first direction.

In this manner, the power strap used in this example embodiment may be not only provided on the boundary of the standard cell, but also arranged on the same row as any signal line of the standard cell.

Figure 6:
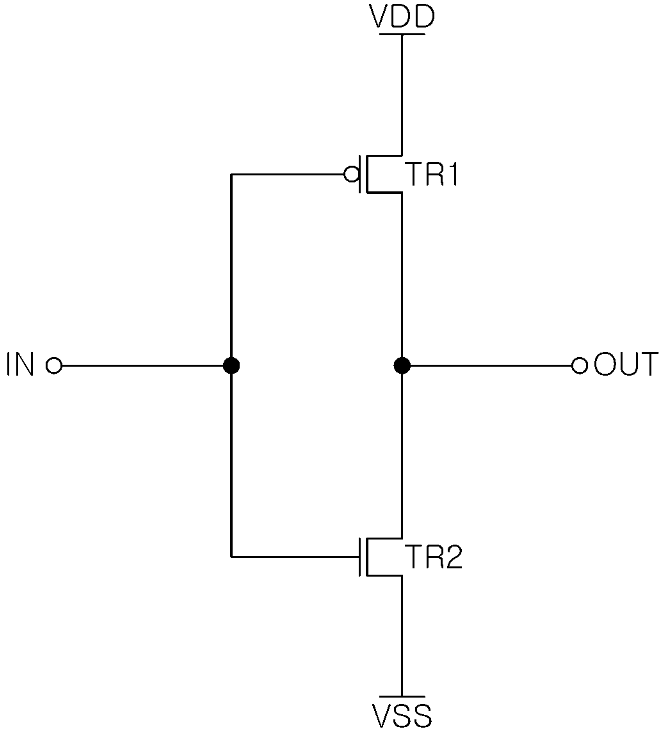
FIG. 6 is an equivalent circuit diagram of the standard cell according to an example embodiment of the disclosure.
Figure 7:
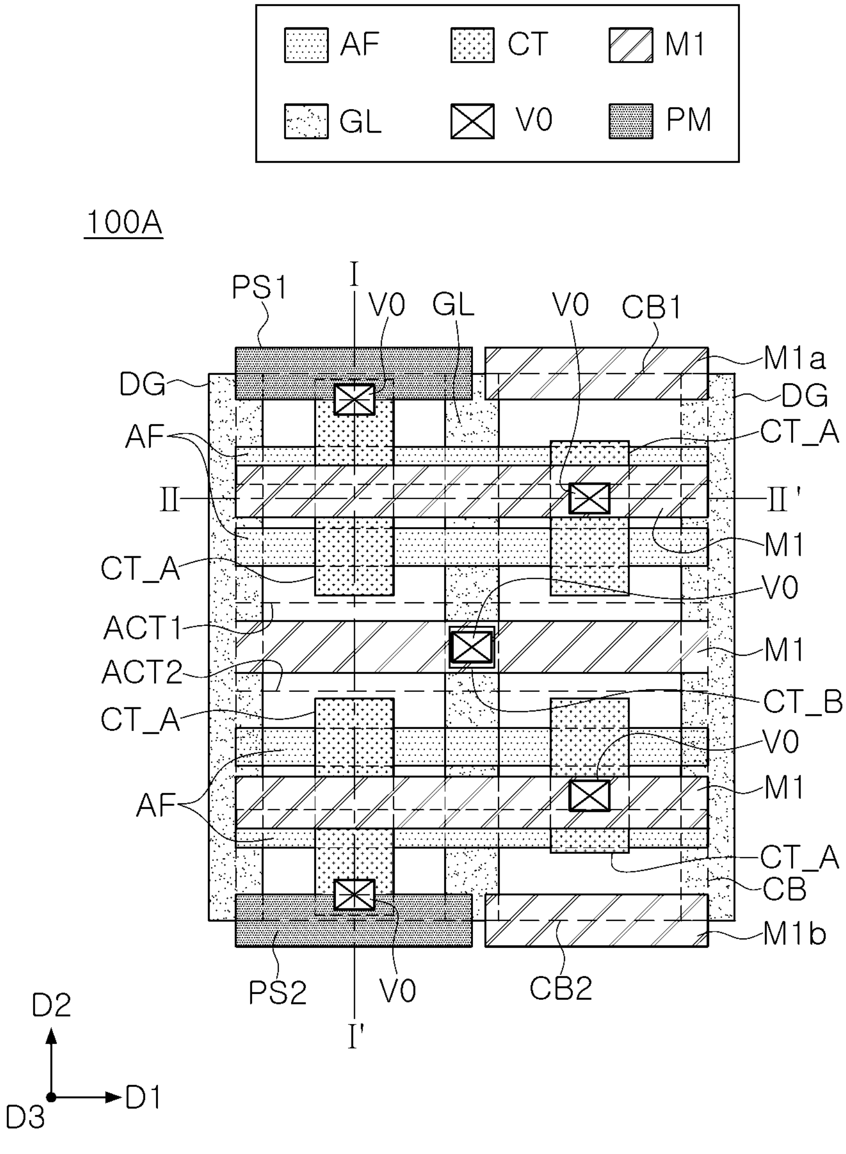
FIG. 7 is a layout diagram of the semiconductor device having the standard cell shown in FIG. 6 according to an example embodiment of the disclosure.

FIG. 6 is an equivalent circuit diagram and FIG. 7 is a layout diagram of the semiconductor device (or standard cell) according to an example embodiment of the disclosure, respectively.

A semiconductor device 100A shown in FIG. 7 may be the standard cell implementing the inverter circuit shown in FIG. 6, and may include a plurality of active patterns AF, a gate line GL, contact structure CT including first contact structures CT_A and second contact structures CT_B, first signal lines M1, first power straps PS1 and second power straps PS2. The standard cell may have a cell boundary CB including first and second boundaries CB1 and CB.

Referring to FIG. 6, the inverter circuit may include a pull-up element TR1 receiving the first power source VDD and a pull-down element TR2 receiving the second power source VSS, and gates of the pull-up element TR1 and the pull-down element TR2 may be connected to each other to provide an input terminal IN. Meanwhile, one of the source/drain regions of the pull-up element TR1 and one of the source/drain regions of the pull-down element TR2 may be connected to each other to provide an output terminal OUT. However, such an inverter circuit is only an example of one of the unit circuits that the standard cell may provide, and the standard cells may provide various circuits such as a NAND standard cell and a NOR standard cell in addition to the inverter circuit.

Referring to FIG. 7, the plurality of active patterns AF may be extending in the first direction D1, and arranged in the second direction D2 intersecting the first direction D1. The semiconductor device 100A according to this example embodiment may include first and second active regions ACT1 and ACT2, provided in the second direction D2, and two active patterns AF may respectively be provided in the first and second active regions ACT1 and ACT2. A gate structure GL may intersect the plurality of active patterns AF, and may be extending in the second direction D2. The standard cell may include source/drain regions 120 (in FIGS. 9A and 9B) respectively provided on the plurality of active patterns AF positioned on both sides of the gate structure GL. Similar to the gate structure GL, a dummy gate line DG may be provided at each side of the standard cell to be extending in the second direction.

The first contact structure CT_A may be connected to the active pattern AF (in particular, source/drain region), and the second contact structure CT_B may be connected to the gate structure GL. The first and second contact structures CT_A and CT_B may respectively be connected to the first signal lines M1 and the first and second power straps PS1 and PS2 through contact vias V0.

In this example embodiment, the first and second power straps PS1 and PS2 may respectively be arranged on the same row as signal lines M1*a* and M1*b*, positioned on the first and second cell boundaries. Each of the first and second power straps PS1 and PS2 may have the width equal to that of each of the signal lines M1*a* and M1*b* on the same row. In this manner, the first and second power straps PS1 and PS2 may be provided together with the first signal line M1 to have a relatively thin width, thereby improving the integration of the signal lines.

In order to implement the inverter circuit shown in FIG. 6, the first contact structure CT_A electrically connected to the two active patterns AF positioned in the first active region ACT1 may be connected to the first power strap PS1 through the contact via V0, and the first contact structure CT_A connected to the two active patterns AF positioned in the second active region ACT2 may be connected to the second power strap PS2 through the contact via V0.

The active patterns AF and the gate structure GL intersecting these patterns may form the pull-up element TR1 and the pull-down element TR2 of the inverter circuit. In the inverter circuit shown in FIG. 6, the gate structure GL may be shared by the pull-up element TR1 and the pull-down element TR2. The gate structure GL may be connected to the first signal line M1 positioned at its center through the second contact structure CT_B, which is a gate contact.

The first signal lines M1 may be wirings provided on top of the active patterns AF and the gate structure GL, and may be extending in the first direction D1. In this example embodiment, the first signal line M1 may be a signal transmission line that supplies a signal to the semiconductor device 100A, and may be electrically connected to the gate structure GL. In addition, the first and second power straps PS1 and PS2 may be provided parallel to some signal lines M1*a* and M1*b* at the same level as the first signal line M1, and the first and second power straps PS1 and PS2 and first signal line M1 may be formed in the same process. As described above, the first and second power lines PS1 and PS2 may be power transmission lines that respectively supply different power voltages VDD and VSS to the semiconductor device 100A. The first and second power straps PS1 and PS2 may be provided along the first and second boundaries CB1 and CB2 of the standard cell, and are not limited thereto (see FIG. 5).

Figure 8A:
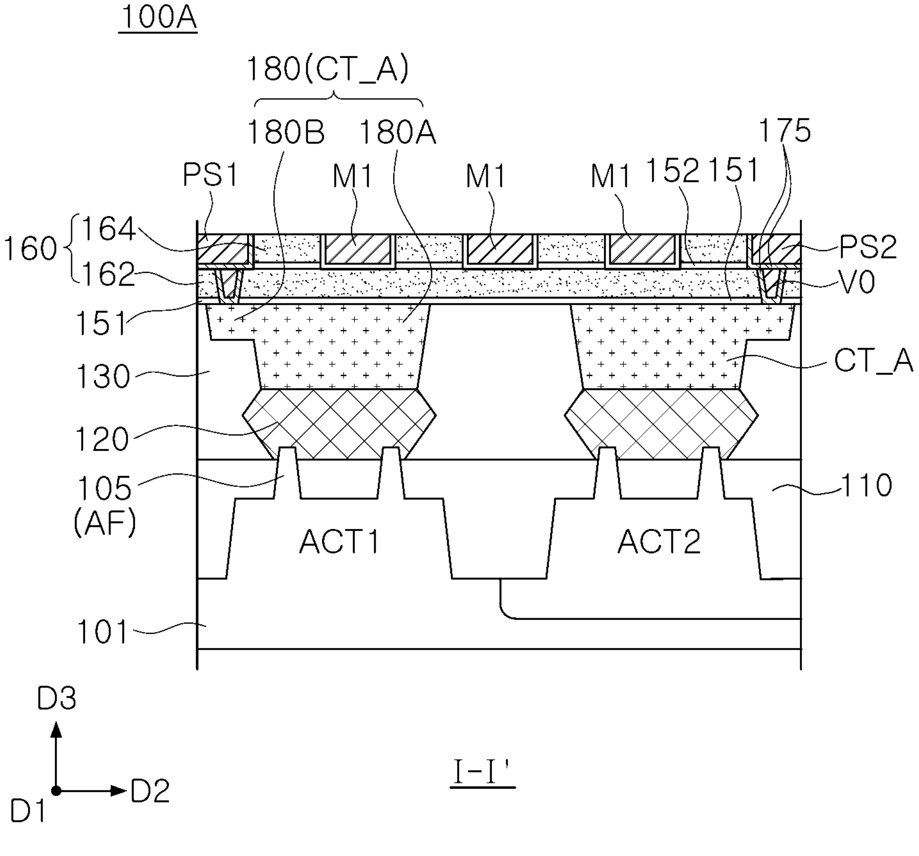
FIGS. 8A and 8B are side cross-sectional views of the semiconductor device shown in FIG. 7, taken along lines I-I' and II-II', respectively.
Figure 8B:
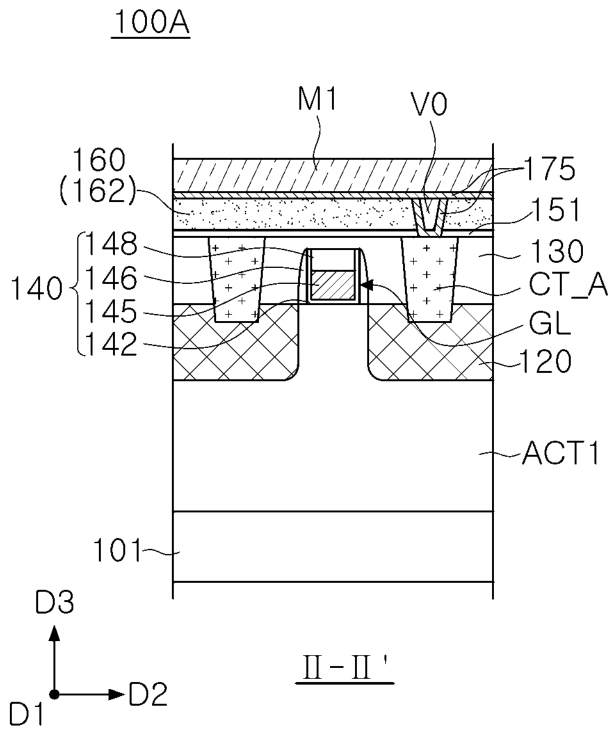

FIGS. 8A and 8B are side cross-sectional views of the semiconductor device 100A shown in FIG. 7, taken along lines I-I' and respectively.

Referring to FIGS. 8A and 8B, the semiconductor device 100A according to this example embodiment may include a substrate 101, the active regions 102 each including the active pattern 105 or AF, an device isolation layer 110, the source/drain region 120, a gate structure 140 or GL having a gate electrode 145, a lower interlayer-insulating layer 130, a contact structure 180 (i.e., CT_A or CT_B), an upper interlayer-insulating layer 160, the first signal line M1 and the first and second power straps PS1 and PS2.

The substrate 101 may have a top surface extending in the first direction D1 and the second direction D2. The substrate 101 may include a semiconductor material, for example, a group IV compound semiconductor, a group III-V compound semiconductor or a group II-VI compound semiconductor. For example, the group IV compound semiconductor may include silicon, germanium or silicon-germanium. The substrate 101 may have the first active region ACT1, and may have the second active region ACT2 including a doped region such as the N-well.

The device isolation layer 110 may define the active region 102 in the substrate 101. The device isolation layer 110 may be formed by, for example, a shallow trench isolation (STI) process. As shown in FIG. 8A, the device isolation layer 110 may include a region extending deeper below the substrate 101, between the first and second active regions ACT1 and ACT2, and is not limited thereto. The device isolation layer 110 may be made of an insulating material, and may include, for example, oxide, nitride or a combination thereof.

The plurality of active patterns AF may be defined in the substrate 101 by the device isolation layer 110, and may be extending in the first direction D1. The active pattern AF used in this example embodiment may include a fin structure (or also referred to as "active fin 105") protruding from the substrate 101 in a third direction D3. The active fin 105 may have an upper end protruding to a predetermined height from a top surface of the device isolation layer 110. The active fin 105 may be made as a portion of the substrate 101, and may include an epitaxial layer grown from the substrate 101. The active fin 105 positioned on each of the two sides of the gate structure GL may be partially recessed, and the source/drain region 120 may be provided on the recessed active fin 105. In some example embodiment, the active region ACT may have the doped region including impurities. For example, the active fin 105 may include the impurities diffused from the source/drain region 120 in its region in contact with the source/drain region 120.

As shown in FIG. 8B, the source/drain region 120 may be provided in the regions in which the active fin 105 positioned on each of the two sides of the gate structure GL or 140 is recessed. In this example embodiment, the source/drain region 120 may have a recess formed in some regions of the active fin 105, and may have a top surface of a higher level than the top surface of the active fin 105 by allowing the recess to have a selective epitaxial growth (SEG). The source/drain region 120 may serve as a source region or drain region of the transistor. The top surface of the source/drain region 120 may be positioned at the same or similar height level as a lower surface of the gate structure GL. In an example embodiment, a relative height of the source/drain region 120 and the gate structure (GL) may be variously changed.

The source/drain regions 120 may each have a shape of merged regions connected to each other between the adjacent active fins 105 in the second direction D2, as shown in FIG. 8A, and are not limited thereto. The source/drain region 120 may have a shape of angled sides based on its cross section shown in FIG. 8A. However, in the example embodiments, the source/drain region 120 may have any of various shapes, for example, any one shape of a polygon, a circle, an ellipse and a rectangle.

The source/drain region 120 may be formed of the epitaxial layer, and may include, for example, silicon (Si), silicon germanium (SiGe) or silicon carbide (SiC). In addition, the source/drain region 120 may further include the impurities such as arsenic (As) and/or phosphorus (P). In some example embodiments, the source/drain region 120 may include a plurality of regions including different concentrations of an element and/or a doping element.

The gate structure GL may intersect the active fin 105, and may be extending in the second direction D2. A channel region of the transistor may be formed in the active fin 105 intersecting the gate structure GL. The gate structure GL may include a gate spacer 146, a gate insulating film 142, a gate electrode 145 and a gate capping layer 148.

The gate insulating film 142 may be provided between the active fin 105 and the gate electrode 145. In some example embodiments, the gate insulating film 142 may include a plurality of layers or may be extending to a side surface of the gate electrode 145. The gate insulating film 142 may include oxide, nitride or a high dielectric material (or. high-k material). The high dielectric material may be a dielectric material having a higher dielectric constant than a silicon oxide layer ($SiO_2$). The gate electrode 145 may include a conductive material, and may include, for example, a metal nitride such as titanium nitride (TiN), tantalum nitride (TaN) or tungsten nitride (WN), and/or a metal material such as aluminum (Al), tungsten (W) or molybdenum (Mo). Alternatively, the gate electrode 145 may include a semiconductor material such as doped polysilicon. The gate electrode 145 may include two or more multi-layers. The gate electrodes 145 may be provided to be separated from each other between at least some adjacent transistors in the second direction D2 based on a configuration of the circuit of the semiconductor device 100A. For example, a separate gatecut may be formed on the gate electrode 145 to have the plurality of gate electrodes 145 separated from each other.

The gate spacers 146 may be positioned on both sides of the gate electrode 145. The gate spacer 146 may insulate the source/drain region 120 from the gate electrode 145. In some example embodiments, the gate spacer 146 may have a multi-layer structure. The gate spacer 146 may include oxide, nitride, oxynitride, and in particular, a low dielectric material. For example, the gate spacer 146 may include at least one of silicon oxide ($SiO_2$), silicon nitride (SiN), silicon cyanide (SiCN), silicon oxycarbide (SiOC), Silicon oxynitride (SiON) and silicon oxycarbonnitride (SiOCN).

The gate capping layer 148 may be provided on a top of the gate electrode 145, and the lower surface and side surfaces thereof may respectively be surrounded by the gate electrode 145 and the gate spacer 146. For example, the gate capping layer 148 may include oxide, nitride and oxynitride.

The lower interlayer-insulating layer 130 may be provided to cover the source/drain region 120 and the gate structure GL. The lower interlayer-insulating layer 130 may include, for example, at least one of oxide, nitride and oxynitride, and may include a low dielectric material.

The contact structure 180 may include the first contact structure CT_A connected to the source/drain region 120 by penetrating through the lower interlayer-insulating layer 130 and the second contact structure CT_B shown in FIG. 7, connected to the gate electrode 145 by penetrating through the lower interlayer-insulating layer 130 and the gate capping layer 148. The first contact structure CT_A may be provided by recessing the source/drain region 120 to a predetermined depth.

The contact structure 180 may include a metal material such as tungsten (W), aluminum (Al) or copper (Cu), or the semiconductor material such as doped polysilicon. In addition, in some example embodiments, the contact structure 180 may include a conductive barrier or a metal-semiconductor layer such as a silicide layer that is provided at an interface on which the contact structure 180 is in contact with the source/drain region 120 and the gate electrode 145.

The upper interlayer-insulating layer 160 may include first and second low dielectric layers 162 and 164 covering the contact structures 180. The first and second etch stop layers 151 and 152 may respectively be provided on lower surfaces of the first and second low dielectric layers 162 and 164. The first signal line M1 and the first and second power straps PS1 and PS2 may be provided on the second dielectric layer 164. The contact via V0 may pass through the first dielectric layer 162 to connect the contact structure 180 and the first and second power straps PS1 and PS2 to each other. In this example embodiment, a conductive barrier layer 175 may be further included in each of the first signal line M1, the first and second power straps PS1 and PS2, and the contact via V0. This example embodiment exemplary describes that this wiring structure is a structure formed by a single damascene process, and is not limited thereto.

Meanwhile, in this example embodiment, as shown in FIG. 8A, the contact structure 180 may include a main portion 180A connected to the source/drain region 120, and an extension portion 180B extending from the main portion 180A below the first and second power straps PS1 and PS2, in which the contact via V0 may be connected to the extension portion to connect the contact structure 180 to each of the first and second power straps PS1 and PS2. For example, the first and second low dielectric layers 162 and 164 may include at least one of silicon monoxide (SiO), SiN, SiCN, SiOC, SiON and SiOCN; and the etch stop layers 151, 152 and 153 may each include the high dielectric material, for example, silicon nitride or aluminum oxide. For example, the first signal line M1, the first and second power straps PS1 and PS2, and the contact via V0 may each include at least one of aluminum (Al), copper (Cu) and tungsten (W).

In this manner, the semiconductor device 100A according to this example embodiment may introduce, as the pattern for a power tap, the first and second power straps PS1 and PS2, provided on the same row as the signal lines M1*a* and M1*b*, while being parallel to the signal lines M1*a* and M1*b*, instead of using the power rails each having the relatively large width, thereby improving the density and design freedom of the signal lines under the same arrangement condition.

Figure 9A:
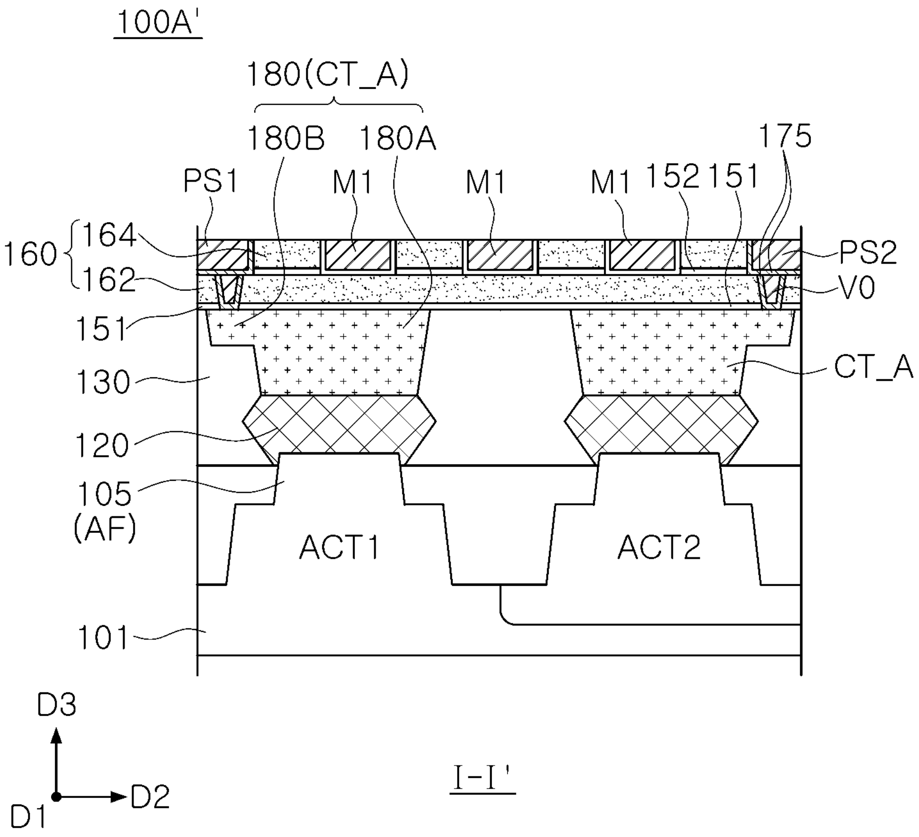
FIGS. 9A and 9B are cross-sectional views of the semiconductor device according to an example embodiment of the disclosure.
Figure 9B:
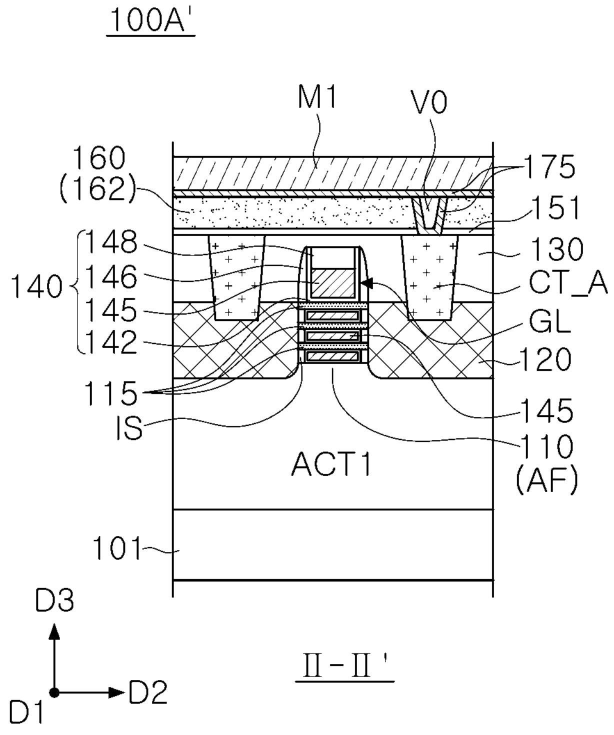

Each of FIGS. 9A and 9B is a side cross-sectional view of the semiconductor device according to an example embodiment of the disclosure.

Referring to FIGS. 9A and 9B, a semiconductor device 100A' according to this example embodiment may be similar to the semiconductor device 100A shown in FIGS. 6 through 8B except that the semiconductor device 100A' has the active pattern AF provided in each of the first and second active regions ACT1 and ACT2, and a channel structure using a plurality of nanosheets, formed on the active pattern. In addition, the components of this example embodiment may be understood with reference to the descriptions of the same or similar components of the semiconductor device 100A, shown in FIGS. 6 through 8B, unless particularly described to the contrary.

Like the previous example embodiment, the semiconductor device 100A' according to this example embodiment may include the substrate 101, the first and second active regions ACT1 and ACT2 each including the active pattern 105 or AF, the device isolation layer 110, the source/drain region 120, the gate structure 140 or GL having the gate electrode 145, the lower interlayer-insulating layer 130, the contact structure 180 (i.e., CT_A or CT_B), the upper interlayer-insulating layer 160, first signal lines M1, M1*a*, and M1*b*, and the first and second power straps PS1 and PS2.

Referring to FIGS. 9A and 9B, the semiconductor device 100A' may further include a plurality of channel layers 115 provided on the active pattern AF or 110 while being vertically spaced apart from each other and an inner spacer IS provided between the plurality of channel layers 115 while being parallel to the gate electrode 145. In the semiconductor device 100A', the gate electrode 145 may include transistors of a gate-all-around structure in which the transistors are provided between the active fin 110 and the channel layers 115 and between the plurality of channel layers 115, each having a shape of the nanosheet. For example, the semiconductor device 100A' may include the transistors each having the channel layer 115, the source/drain region 120 and the gate electrode 145.

The plurality of channel layers 115 may be two or more channel layers each provided on the active pattern 110 while being spaced apart from each other in the third direction D3, perpendicular to the top surface of the active pattern 110. The channel layer 115 may be connected to the source/drain region 120 and may be spaced apart from the top surface of the active fin 110. The channel layer 115 may have the same or similar width as the active fin 110 in the second direction D2, and may have the same or similar width as the gate structure 140 in the first direction D1. However, when the semiconductor device 100A' of this example embodiment uses the internal spacer IS, the channel layers 115 may have a width reduced more than a lower surface of the gate structure 140.

The plurality of channel layers 115 may each be made of the semiconductor material, and may include, for example, at least one of silicon (Si), silicon germanium (SiGe) and germanium (Ge). The channel layer 115 may be made of, for example, the same material as the substrate 101. The number and shape of the channel layer 115 included in one channel structure may be variously changed according to example embodiments. For example, the channel layer 115 may be further provided in a region where the active fin 110 is in contact with the gate electrode 145 according to example embodiments.

The gate structure 140 may be extending on top of the active pattern 110 and the plurality of channel layers 115 while intersecting the active pattern 110 and the plurality of channel layers 115. A channel region of the transistor may be formed in the active pattern 110 and the plurality of channel layers 115, intersecting the gate structure 140. In this example embodiment, the gate insulating film 142 may not only be provided between the active fin 110 and the gate electrode 145, but also between each of the plurality of channel layers 115 and the gate electrode 145. The gate electrodes 145 may respectively be extended from the top of the active fins 110 to the top of the plurality of channel layers 115 while filling each space between the plurality of channel layers 115. The gate electrode 145 may be spaced apart from each of the plurality of channel layers 115 by the gate insulating film 142.

The inner spacer IS may be provided between the plurality of channel layers 115 while being parallel to the gate electrode 145. The gate electrode 145 may be spaced apart and electrically separated from the source/drain region 120 by the internal spacers IS. The inner spacer IS may have a flat side surface facing the gate electrode 145 or a convexly rounded shape toward the inside of the gate electrode 145. The inner spacer IS may be made of oxide, nitride or oxynitride, and in particular, a low-k film.

As described above, the semiconductor device according to this example embodiment may be applied to the transistor of any of various structures, and may be implemented as a semiconductor device including a vertical field effect transistor (i.e., vertical FET, VFET) having an active region extending perpendicularly to the top surface of the substrate and the gate structure surrounding the active region, or a semiconductor device including a negative capacitance FET (NCFET) using a gate insulating film having a ferroelectric feature, in addition to the example embodiments described above.

Figure 10A:
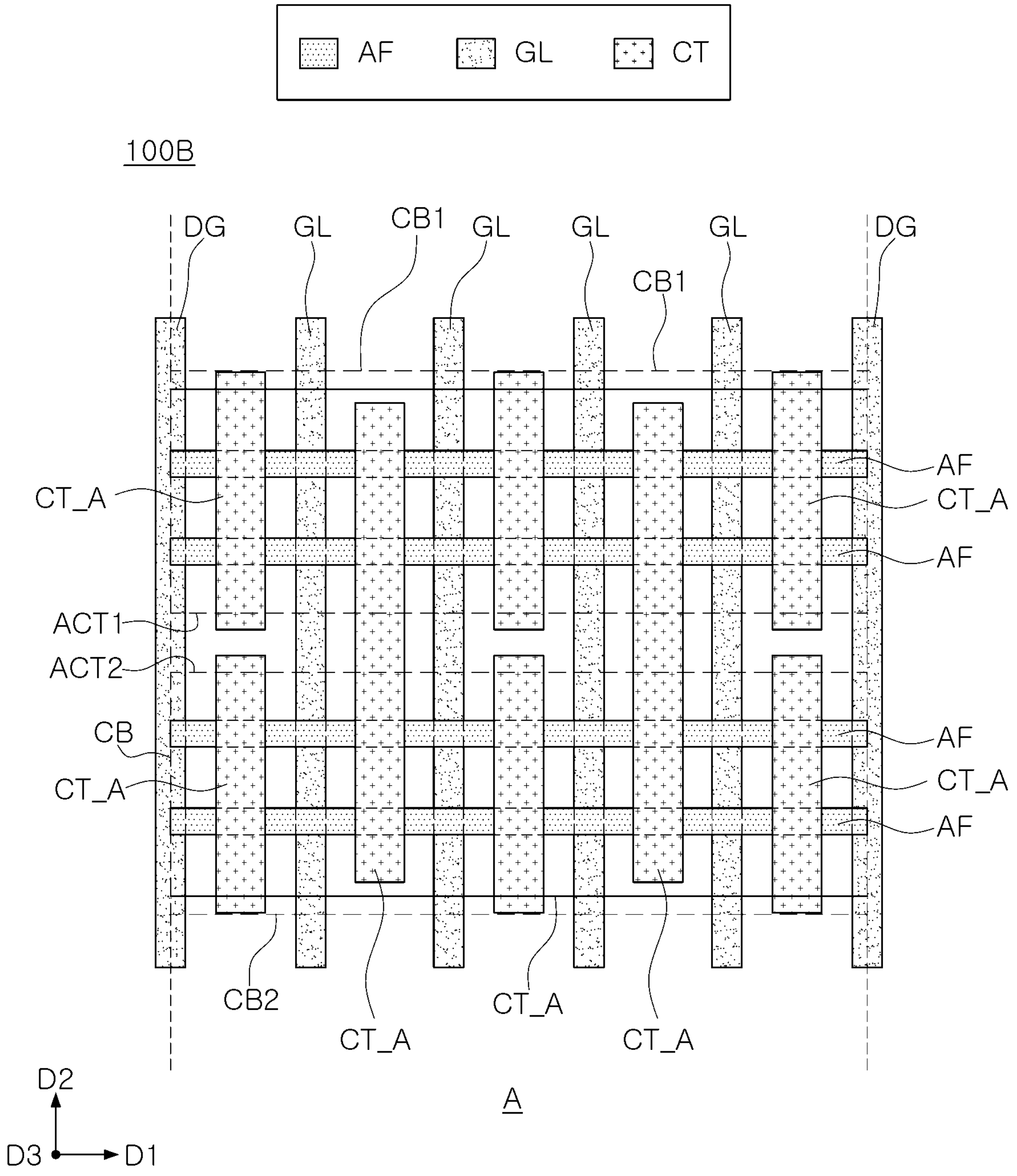
FIGS. 10A and 10B are layout diagrams of a standard cell (before/after forming a first signal line) according to another example embodiment of the disclosure.
Figure 10B:
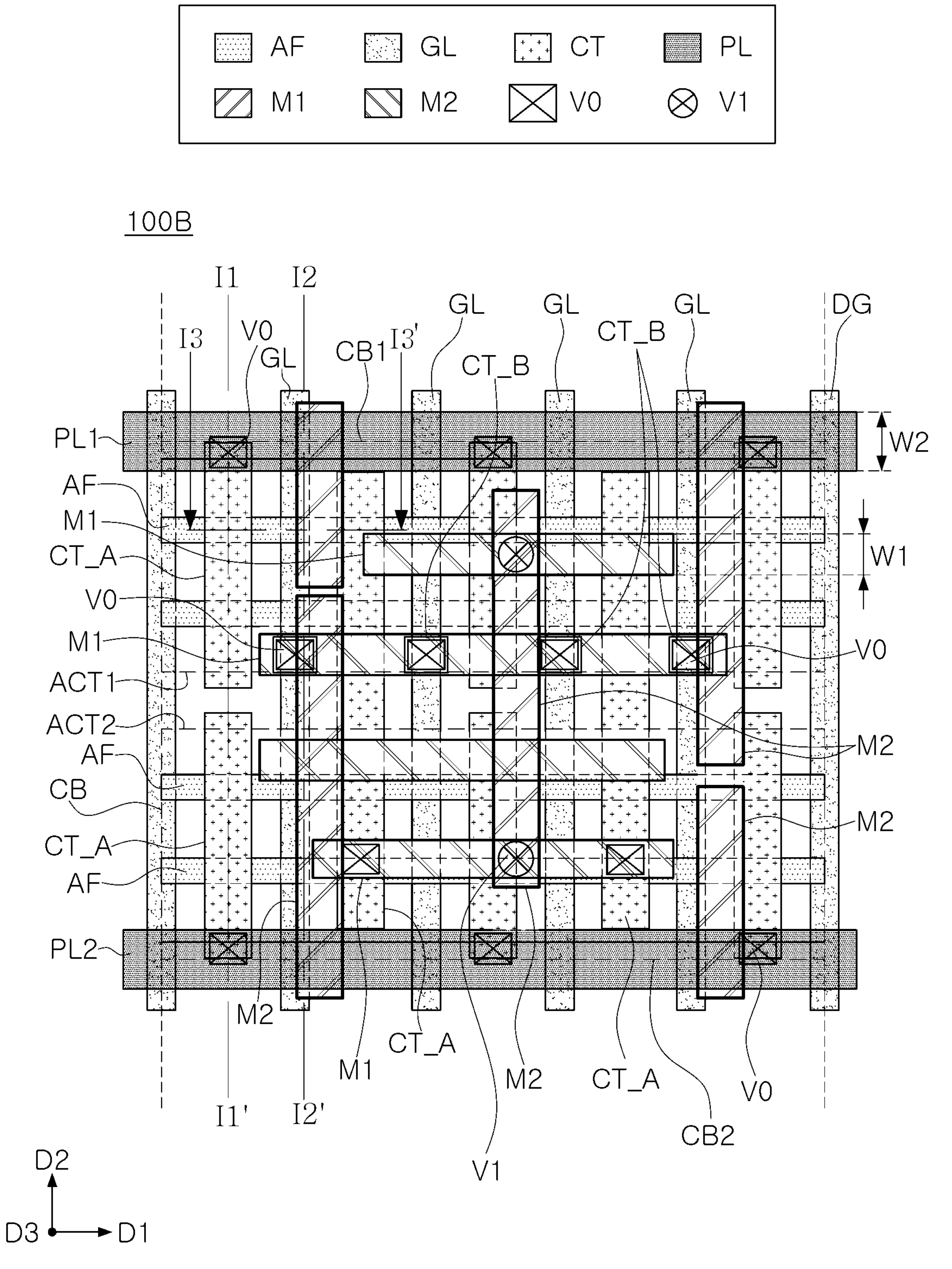
Figure 11:
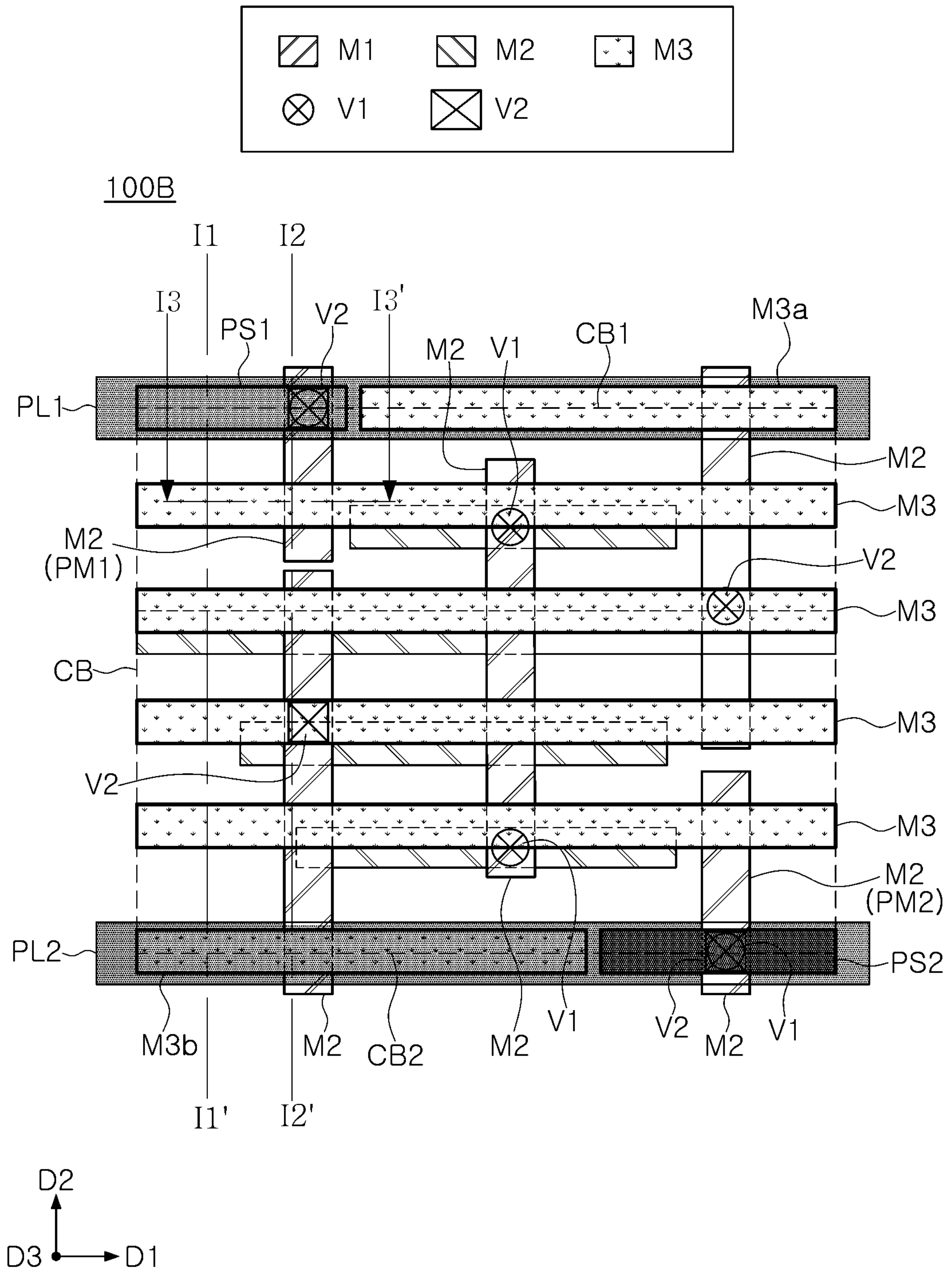
FIG. 11 is a layout diagram of a routing structure used in the standard cell (or semiconductor device) shown in FIG. 10B.

FIGS. 10A and 10B are layout diagrams of a standard cell (before/after forming the first signal line) according to another example embodiment of the disclosure; and FIG. 11 is a layout diagram of a routing structure used in the standard cell (or semiconductor device) shown in FIG. 10B.

Referring to FIGS. 10A and 10B, a semiconductor device 100B according to this example embodiment may be understood as the "standard cell SC1" corresponding to an inverter element having four p-type transistors and four n-type transistors, and may be the semiconductor device 100B as shown in FIG. 9B.

Referring to FIG. 10A, the semiconductor device 100B according to this example embodiment may include first and second active regions ACT1 and ACT2 of different conductivity types, and the plurality of active patterns AF protruding from the first and second active regions ACT1 and ACT2 in the third direction D3 and extending in the first direction D1 (herein, also referred to as "active fin").

For example, the first active region ACT1 may be a p-type semiconductor substrate or a p-type active region PR provided as a p-type well, and may be provided as a region for the n-type transistor. The second active region ACT2 may be an n-type active region NR provided as an n-type well, and may be provided as a region for the p-type transistor.

As shown in FIG. 10A, the plurality of active patterns AF may include four active fins, and two active patterns AF may be provided in each of the first and second active regions ACT1 and ACT2. The four active fins AF may be spaced apart from each other in the second direction D2. The cell boundary CB may be extending in the first direction D1 and may include the first and second boundaries CB1 and CB2 opposing each other in the second direction D2.

This example embodiment shows that the plurality of active fins AF are four active fins, and the same number of active patterns AF, e.g. two active patterns, are provided in each of the first and second active regions ACT1 and ACT2, for example. However, different numbers (one, or three or more) of active fins may be provided in the first and second active regions ACT1 and ACT2.

In addition, the standard cell 100B (or semiconductor device) shown in FIG. 10A may include six gate lines GL and DG extending in the second direction D2 to intersect the four active fins AF, where DG may be a dummy gate structure. The gate lines GL and DG may be arranged by a predetermined pitch in the first direction D1. In this example embodiment, the gate lines GL and DG may include the dummy gate structures DG positioned at both boundaries of the standard cell 100B, and four gate lines arranged between the dummy gate structures DG may each serve as the gate structure GL included in the transistor.

The first contact structures CT_A may be provided on the active fins AF positioned on both sides of the four gate structures GL. In this example embodiment, the first contact structures CT_A may be extending over two active fins AF respectively provided on the first and second active regions ACT1 and ACT2. The first contact structures CT_A may serve as source/drain contacts. Some of the first contact structures CT_A may be extending to be adjacent to the first or second boundary CB1 or CB2 facing the contact structure in the second direction D2 in order to be connected to the power transmission line.

Referring to FIG. 10B, the semiconductor device 100B according to this example embodiment may be a standard cell which is based on a pattern layout of the semiconductor device shown in FIG. 10A and to which the second contact structures CT_B in contact with the gate electrode, the first and second signal lines M1 and M2, and first and second power lines PL1 and PL2 are added.

The first and second power lines PL1 and PL2 may respectively be provided on the first and second boundaries CB1 and CB2. Four first signal lines M1 extending in the first direction D1 may be arranged by the same pitch (and/or space) between the first and second power lines PL1 and PL2. It is possible to omit at least one of the four first signal lines M1 arranged by the same pitch in a unit standard cell. For example, in this example embodiment, it is possible to omit the first signal of the second from the top among the four first signal lines M1 because this signal is not connected to the other lines or the active region and thus does not form a circuit The first and second power lines PL1 and PL2 may respectively be connected to some portions of the first contact structures CT_A by the contact vias V0 (see FIG. 11A), and two first signal lines M1 respectively adjacent to the first and second power lines PL1 and PL2 may respectively be connected to other portions of the first contact structures CT_A by the contact vias V0. One of the first signal lines M1 positioned between the two first signal lines M1 respectively adjacent to the first and second power lines PL1 and PL2 may respectively be connected to the second contact structures CT_B by the contact vias V0 to be connected to each of the four gate structures GL (see FIG. 11B). In this manner, on a first level of the standard cell, the first and second power lines PL1 and PL2 may be provided parallel to the plurality of first signal lines M1 in the second direction D2.

On a second level higher than the first level, the plurality of second signal lines M2 may be extending in the second direction D2 and arranged in the first direction D1. The second signal line M2 may be provided on the first signal line M1. In this example embodiment, the second signal line M2 positioned at the center of the second signal lines M2 may be connected to two first signal lines M1 respectively adjacent to the first and second power lines PL1 and PL2 by the second vias V1.

By connecting the first and second signal lines M1 and M2, the contact via V0 and the first via V1 to each other, the semiconductor device 100 according to this example embodiment may be the inverter element including the four p-type transistors and the four n-type transistors, arranged between the first and second power lines PL1 and PL2.

In the semiconductor device 100B according to this example embodiment, the pattern for the power tap may be provided on a third level higher than the second level. FIG. 11 is a layout diagram of the routing structure used in the semiconductor device 100B shown in FIGS. 10A and 10B.

Referring to FIG. 11 together with FIG. 10B, some of the plurality of second signal lines M2 may include first and second power supply lines PM1 and PM2. The first and second power supply lines PM1 and PM2 may respectively be connected to the first and second power lines PL1 and PL2 through the first via V1.

On the third level, a plurality of third signal lines M3 may be extending in the first direction D1 and arranged in the second direction D2. The first and second power straps PS1 and PS2 may be extending at the same third level as the plurality of third signal lines M3 in the second direction D2. The first and second power straps PS1 and PS2 may respectively be arranged on the same row as some signal lines M3*a* and M3*b* among the plurality of third signal lines M3 in the first direction D1. Like the above example embodiments, each of the first and second power straps PS1 and PS2 may have the width equal to a width of each of the signal lines M3*a* and M3*b*.

In this example embodiment, the first and second power straps PS1 and PS2 may respectively be positioned on the first and second cell boundaries CB1 and CB2, and may overlap the first and second power lines PL1 and PL2 in the third direction D3. The first and second power straps PS1 and PS2 may respectively be connected to the first and second power supply lines PM1 and PM2 through the second via V2.

In this manner, a voltage applied to the semiconductor device 100B may be transmitted to the first and second power lines PL1 and PL2 through the first and second power straps PS1 and PS2 and the first and second power supply lines PM1 and PM2, respectively.

As shown in FIG. 10B, each width W2 of the first and second power lines PL1 and PL2 may be larger than each width W1 of the plurality of signal lines. In addition, each width W2 of the first and second power lines PL1 and PL2 may be larger than each width of the first and second power straps PS1 and PS2. In this example embodiment, the first and second power lines PL1 and PL2 connected to the first contact structures CT_A may each have the sufficient width, and reducing resistance loss even when each of the first and second power straps PS1 and PS2 provided as the power tap has a small width.

In addition, as shown in FIG. 11, each of the first and second power supply lines PM1 and PM2 may be provided as a pattern for supplying the power, and may not be directly connected to the plurality of first signal lines M1 or the plurality of third signal lines M3.

As described above, each of the first and second power lines PL1 and PL2 may have the width larger than the width W1 of the plurality of first signal lines M1, and the first and second power lines PL1 and PL2 and the plurality of first signal lines M1 may be arranged by the same first interval in the second direction D2. The plurality of third signal lines M3 may be arranged at the same second interval in the second direction D2. In this case, even though the first and second intervals are the same as each other, each width of the first and second power lines PL1 and PL2 may be relatively large as shown in FIG. 11, and some of the plurality of third signal lines M3 may be arranged to only partially overlap the plurality of first signal lines M1 in the third direction D3. In some example embodiments, at least one of the plurality of third signal lines M3 may not overlap the plurality of first signal lines M1.

In this example embodiment, the power strap may be provided on the same row as the signal line at a higher level (e.g., third signal line) while being parallel thereto even when the pattern for the power tap is positioned on the line at the higher level. The third signal lines M3 may be arranged with higher integration than the first signal lines M1 even when arranged by the same interval or pitch as the first signal lines M1.

Figure 12A:
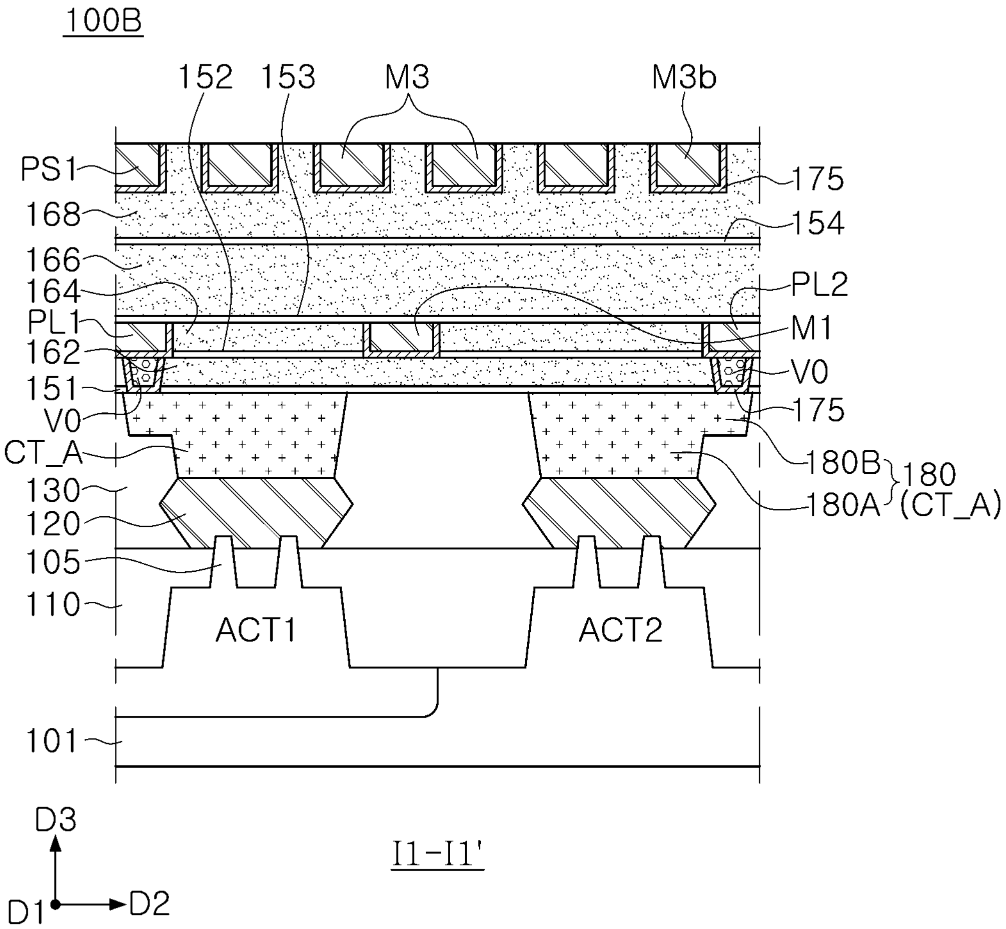
FIGS. 12A, 12B and 12C are cross-sectional views of the semiconductor device shown in FIGS. 10B and 11, respectively, taken along lines I1-I1', I2-I2' and I3-I3'.
Figure 12B:
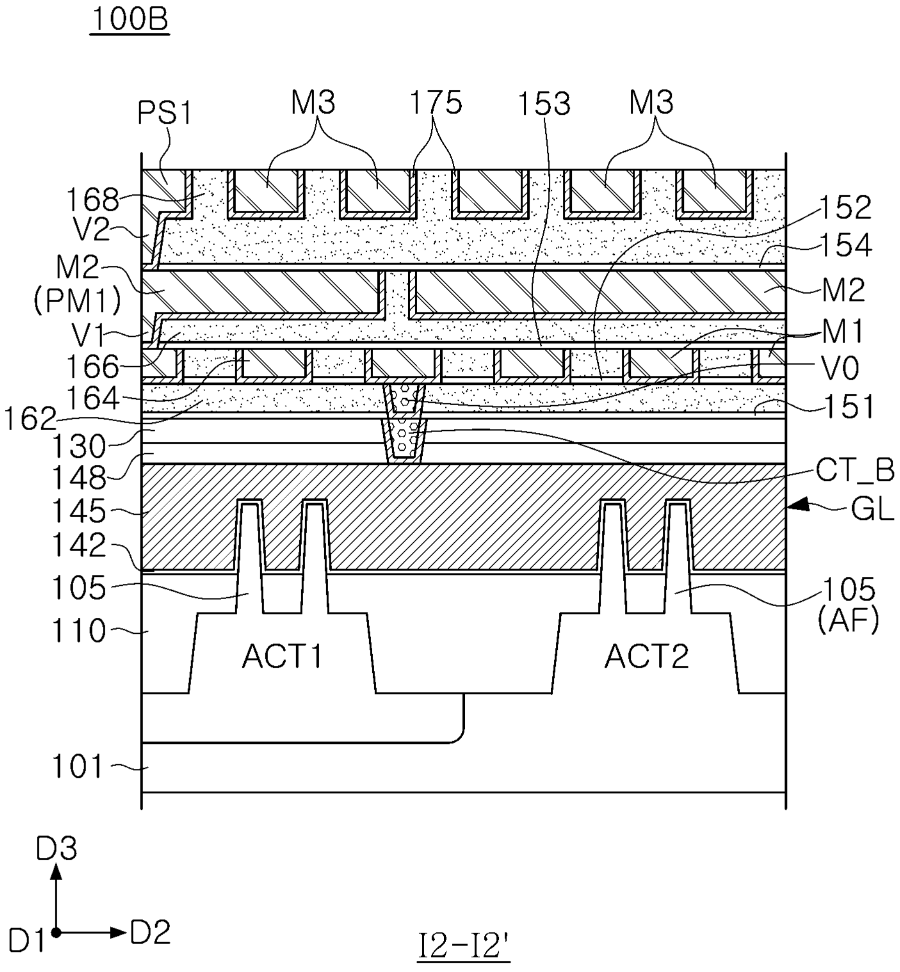
Figure 12C:
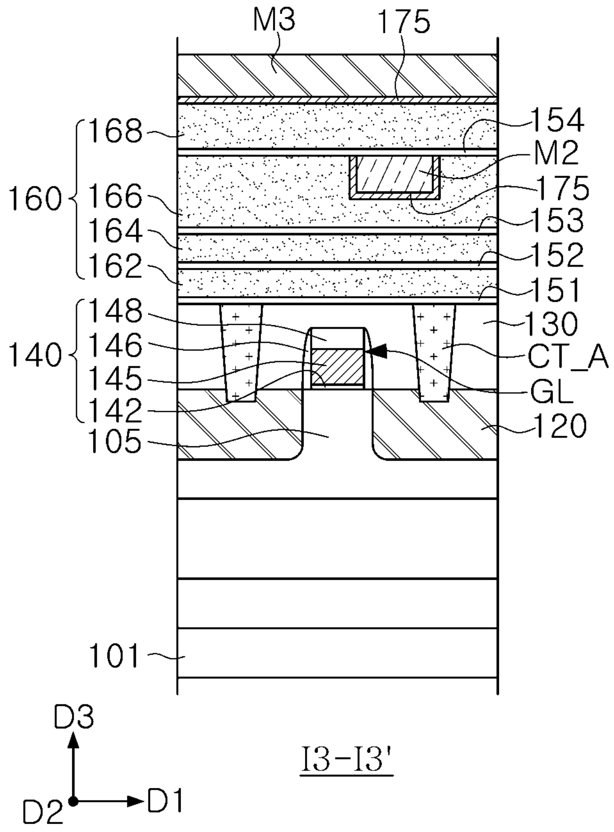

FIGS. 12A through 12C are cross-sectional views of the semiconductor device shown in FIGS. 10B and 11, respectively, taken by I1-I1', I2-I2' and II-II'.

Referring to FIGS. 12A through 12C, the semiconductor device 100B according to this example embodiment may include the substrate 101, the active regions 102 each including the active pattern 105 or AF, the device isolation layer 110, the source/drain region 120, the gate structure 140 having the gate electrode 145, the lower interlayer-insulating layer 130, the contact structure 180 (i.e., CT_A or CT_B), the upper interlayer-insulating layer 160 and first to third signal lines M1, M2 and M3.

The substrate 101 may have the top surface extending in the first direction D1 and the second direction D2. For example, the substrate 101 may have the first active region ACT1, and may have the second active region ACT2 including a doped region such as the N-well. The first and second active regions ACT1 and ACT2 may be defined in the substrate 101 by the device isolation layer 110, and may be extending in the first direction D1.

The active pattern AF used in this example embodiment may include the active fin 105 protruding from the substrate 101 in the third direction D3. The active fin 105 may have the upper end protruding to a predetermined height from the top surface of the device isolation layer 110. The active fin 105 positioned on each of the two sides of the gate structure GL may be partially recessed, and the source/drain region 120 may be provided on the recessed active fin 105. In some example embodiment, the active region ACT may have the doped region including impurities. The source/drain region 120 may be provided in the region in which the active fin 105 positioned on each of the two sides of the gate structure GL or 140 is recessed. The source/drain regions 120 may each have the shape of merged regions connected to each other between the adjacent active fins 105 in the second direction D2, as shown in FIG. 12A.

The gate structure GL may intersect the active fin 105, and may be extending in the second direction D2. The channel region of the transistor may be formed in the active fin 105 intersecting the gate structure GL. The gate structure GL may include the gate spacer 146, the gate insulating film 142, the gate electrode 145 and the gate capping layer 148, like the above example embodiment (see FIGS. 8A and 8B).

The lower interlayer-insulating layer 130 may be provided to cover the source/drain region 120 and the gate structure GL. The lower interlayer-insulating layer 130 may include, for example, at least one of oxide, nitride and oxynitride, and may include the low dielectric material.

The contact structure 180 may include the first contact structure CT_A connected to the source/drain region 120 by penetrating through the lower interlayer-insulating layer 130 and the second contact structure CT_B connected to the gate electrode 145 by penetrating through the lower interlayer-insulating layer 130 and the gate capping layer 148. In some example embodiments, the contact structure 180 may include the conductive barrier or the metal-semiconductor layer such as a silicide layer that is provided at the interface on which the contact structure 180 is in contact with the source/drain region 120 and the gate electrode 145.

The upper interlayer-insulating layer 160 may include first to fourth low dielectric layers 162, 164,166 and 168 covering the contact structure 180. First to fourth etch stop layers 151, 152, 153 and 154 may respectively be provided on lower surfaces of the first to fourth low dielectric layers 162, 164, 166 and 168.

The first signal lines M1 extending in the first direction D1 and the first and second power lines PL1 and PL2, each having a relatively large width, may respectively be provided on the second dielectric layer 164. The contact via V0 may pass through the first dielectric layer 162 to connect the first and second power lines PL1 and PL2 to the contact structure 180.

The second signal lines M2 and the first and second power supply lines PM1 and PM2, extending in the second direction D2, may respectively be provided on the third dielectric layer 166, and the first and second power supply lines PM1 and PM2 may respectively be connected to the first and second power lines PL1 and PL2 through the first via V1.

The third signal lines M3 and the first and second power straps PS1 and PS2, extending in the first direction D1, may respectively be provided on the fourth dielectric layer 168, and the first and second power straps PS1 and PS2 may respectively be connected to the first and second power supply lines PM1 and PM2 through the second via V2.

In this example embodiment, the conductive barrier layer 175 may be further included in each of the first to the third signal lines M1, M2 and M3, the first and second power straps PS1 and PS2, the first and second power supply lines PM1 and PM2, the first and second power lines PL1 and PL2, the contact via V0 and the first and second vias V1 and V2. This wiring structure may be formed by the single damascene process or a dual damascene process.

As shown in FIG. 12A, like the previous example embodiment (see FIG. 8A), the contact structure 180 may include the main portion 180A connected to the source/drain region 120, and the extension portion 180B extending from the main portion 180A below the first and second power lines PL1 and PL2, in which the contact via V0 may be connected to the extension portion to connect the contact structure 180 to each of the first and second power lines PL1 and PL2.

Figure 13:
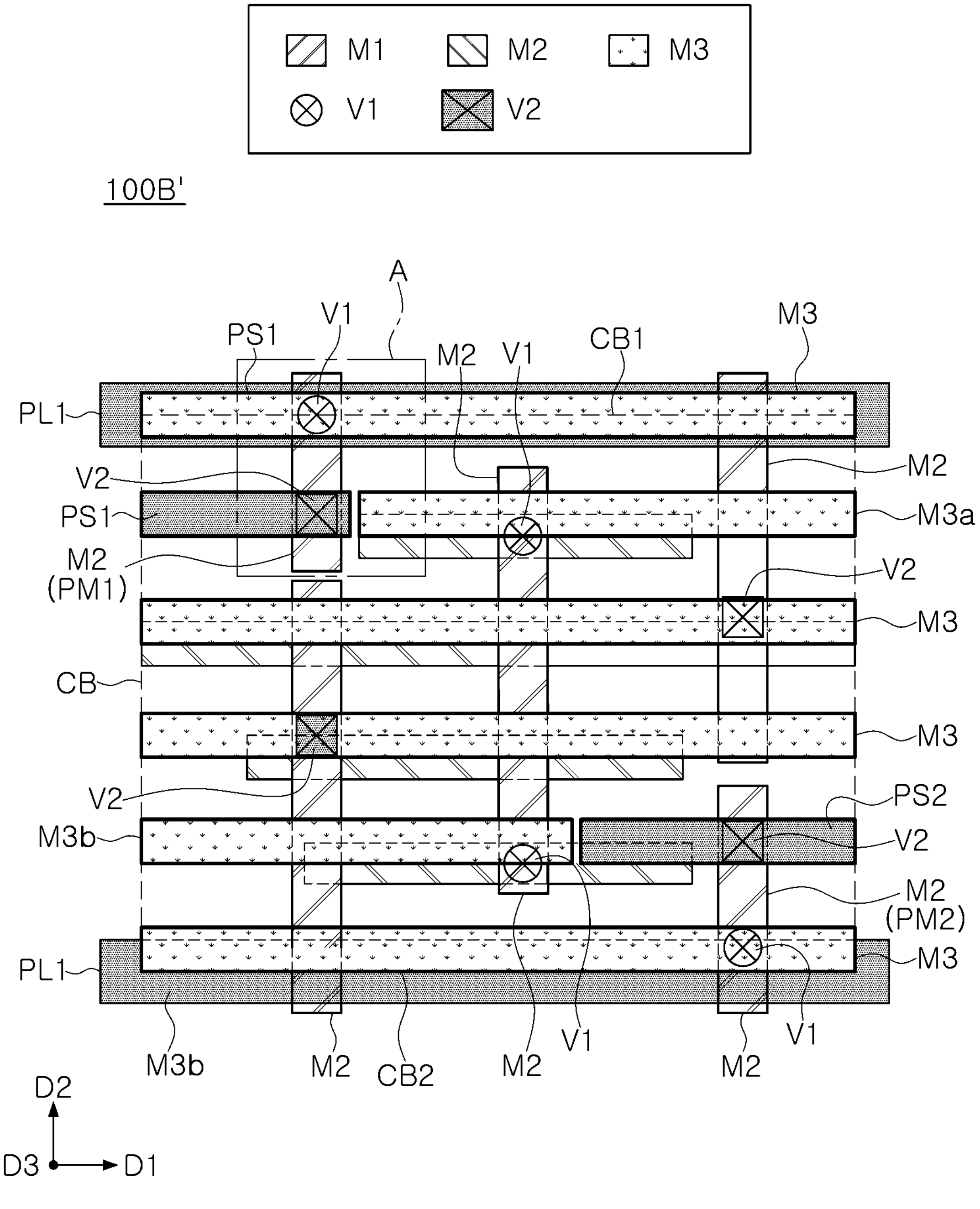
FIG. 13 is a layout diagram of a routing structure used in a standard cell according to yet another example embodiment of the disclosure.

FIG. 13 is a layout diagram of a routing structure used in a standard cell 100B' according to yet another example embodiment of the disclosure.

Referring to FIG. 13, the routing structure of the semiconductor device 100B' according to this example embodiment may be similar to the semiconductor device 100B shown in FIGS. 10A through 12C except that none of the first and second power straps PS1 and PS2 is positioned on either the first cell boundary CB1 or the second cell boundary CB2, resulting in a different wiring connection. In addition, the components of this example embodiment may be understood with reference to the descriptions of the same or similar components of the semiconductor device 100B, shown in FIGS. 10A through 12C, unless particularly described to the contrary.

The routing structure used in this example embodiment may have metal line arrangements of the first and second levels, similar to those of the previous example embodiment. The first and second power lines PL1 and PL2 may respectively be provided on the first and second boundaries CB1 and CB2, and the four first signal lines M1 may be arranged by the same pitch (and/or space) between the first and second power lines PL1 and PL2.

On the second level, the plurality of second signal lines M2 may be extending in the second direction D2 and arranged in the first direction D1. In this example embodiment, the second signal line M2 positioned at the center of the second signal lines M2 may be connected to two first signal lines M1 respectively adjacent to the first and second power lines PL1 and PL2 by the second vias V1.

On the third level, the plurality of third signal lines M3 may be extending in the first direction D1 and arranged in the second direction D2. The first and second power straps PS1 and PS2 may respectively be arranged on the same row as some signal lines M3$a$ and M3$b$ among the plurality of third signal lines M3, while spaced from each other in the first direction D1. Unlike the previous example embodiments, the first and second power straps PS1 and PS2 are offset from the first and second cell boundaries CB1 and CB2, and respectively positioned in the cell boundaries. The third signal line M3 may be provided on the first cell boundary CB1, and the third signal line M3 adjacent to the second cell boundary CB2 may also be offset from the second cell boundary CB2.

Figure 14:
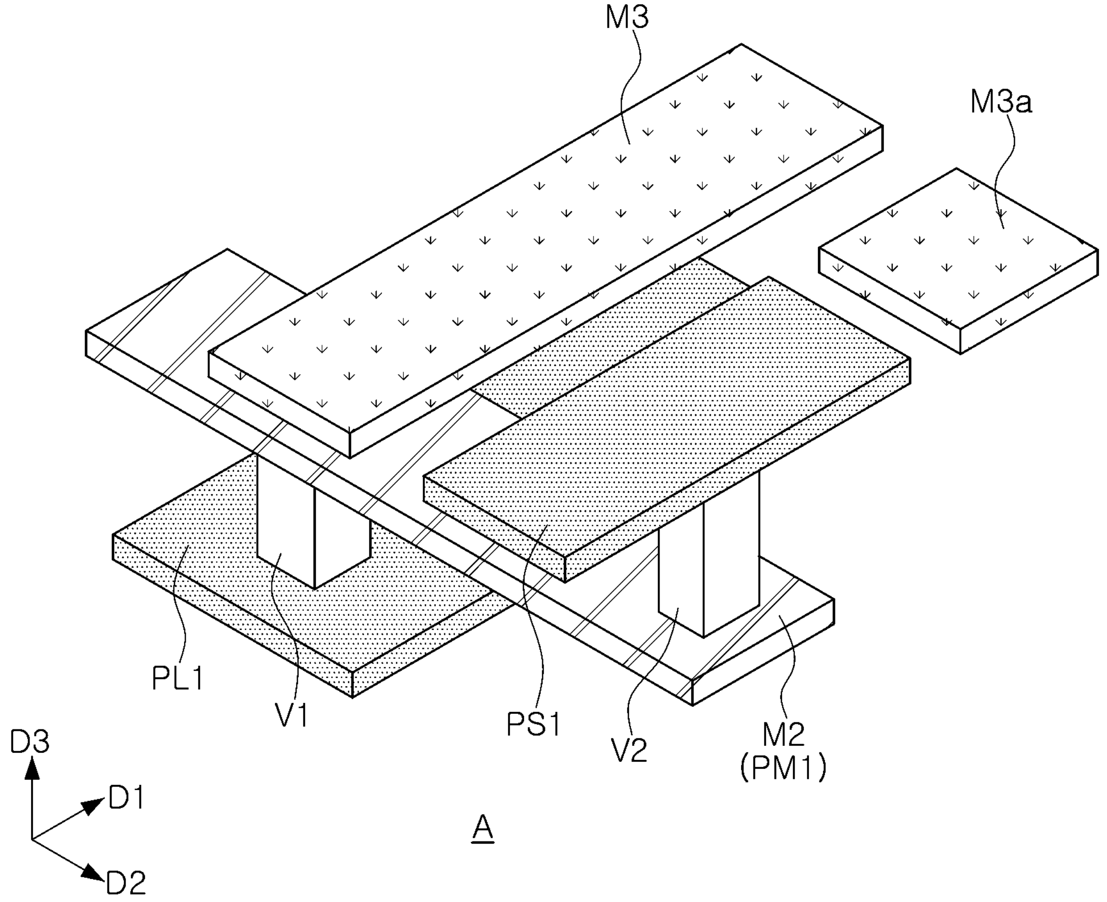
FIG. 14 is a perspective view of an enlarged portion A in the routing structure shown in FIG. 13.

FIG. 14 is a perspective view of an enlarged portion A in the routing structure shown in FIG. 13.

Referring to FIGS. 13 and 14, the first power strap PS1 may be connected to the first power supply line PM1 through the second via V2. The first power supply line PM1 may be extended in the second direction D2 to be positioned on the first power line PL1. The first power supply line PM1 may be connected to the first power line PL1 through the first via V1. Through this path, the voltage (e.g., VDD) may be applied to the semiconductor device 100B'. Similarly, the second power strap PS2, the second via V2, the second power supply line PM2 and the first via V1 may also provide a path through which the voltage (e.g., VSS) may be applied to the semiconductor device 100B' by using the second power line PL2.

In this manner, the voltage applied to the semiconductor device 100B' may respectively be transmitted to the first and second power lines PL1 and PL2 through the first and second power straps PS1 and PS2 and the first and second power supply lines PM1 and PM2, respectively. In addition, the third signal lines M3 may be arranged with the higher integration than the first signal lines M1 even when arranged by the same interval as the first signal lines M1, thus having the improved design freedom at least on the third level.

As set forth above, in the example embodiments of the disclosure, the signal lines may have the improved density and design freedom even under the limited condition of the same pitch between the signal lines by using the power straps provided on the same row as the signal lines while being parallel thereto instead of the power rails each having the relatively large width as the pattern for the power tap.

The disclosure may be defined by the appended claims rather than being limited to the description above and the accompanying drawings. Therefore, it will be apparent to those skilled in the art that various modifications and variations could be made without departing from the scope of the disclosure as defined by the appended claims.

What is claimed is:

1. A semiconductor device comprising:

a standard cell comprising:

a plurality of active patterns extending in a first direction, the plurality of active patterns being spaced apart from each other in a second direction intersecting the first direction, a gate structure intersecting the plurality of active patterns and extending in the second direction, and source/drain regions respectively provided on the plurality of active patterns on both sides of the gate structure;

a plurality of signal lines extending on a first level of the standard cell in the first direction, and electrically connected to the standard cell;

a first power strap and a second power strap extending on the first level of the standard cell in the first direction, each of the first power strap and the second power strap configured as a power tap electrically connected to one or more of the source/drain regions, the first power strap and the second power strap configured to supply power to the standard cell; and a first power line extending in the first direction on a second level, below the first level, on the standard cell, the first power line overlapping the first power strap in a third direction perpendicular to the first direction, wherein each of the first power strap and the second power strap is provided on a same row as one of the plurality of signal lines, wherein each of the first power strap and the second power strap has a first width equal to a second width of the one of the plurality of signal lines and less than a third width of the first power line, and wherein one or more of the plurality of signal lines are provided between the first power strap and the second power strap in the second direction.

2. The semiconductor device of claim 1, wherein the plurality of signal lines are arranged to have a same pitch in the second direction.

3. The semiconductor device of claim 1, wherein at least one of the first power strap and the second power strap is provided on a boundary of the standard cell in the first direction.

4. The semiconductor device of claim 1, wherein at least one of the first power strap and the second power strap is provided in the standard cell.

5. The semiconductor device of claim 1, wherein the first power strap is provided on a first boundary of the standard cell in the first direction, and the second power strap is provided in a region inside the standard cell, adjacent to a second boundary positioned opposite to the first boundary.

6. The semiconductor device of claim 1, wherein the one of the plurality of signal lines includes two signal lines, each of the two signal lines respectively positioned at one end of each of the first power strap and the second power strap.

7. The semiconductor device of claim 1, wherein at least one of the first power strap or the second power strap includes two power straps respectively positioned at both ends of the one of the plurality of signal lines.

8. The semiconductor device of claim 1, wherein the standard cell further includes a first contact structure connected to one of the source/drain regions and positioned in a third direction, perpendicular to the first and second directions, and a second contact structure connected to the gate structure and positioned in the third direction.

9. The semiconductor device of claim 1, wherein each of the plurality of active patterns includes an active fin protruding in a third direction, perpendicular to the first and second directions, and the gate structure includes a gate electrode intersecting the active pattern and extending in the second direction and a gate insulating film provided between the gate electrode and the active fin.

10. The semiconductor device of claim 1, wherein each of the plurality of active patterns includes a structure protruding in a third direction, perpendicular to the first and second directions, the semiconductor device further includes a plurality of channel layers arranged on each of the active patterns while being spaced apart from each other in the third direction and extending in the first direction, respectively, and the gate structure includes a gate electrode surrounding each of the plurality of channel layers and extending in the second direction, and a gate insulating film provided between each of the plurality of channel layers and the gate electrode, and between each of the active patterns and the gate electrode.

11. A semiconductor device comprising:

a standard cell comprising:

a plurality of active patterns extending in a first direction, the plurality of active patterns being spaced apart from each other in a second direction, intersecting the first direction, a gate structure intersecting the plurality of active patterns and extending in the second direction, source/drain regions respectively provided on the plurality of active patterns on both sides of the gate structure, and a plurality of contact structures, each formed on one of the source/drain regions in a third direction, perpendicular to the first and second directions;

a plurality of first signal lines extending on a first level on the standard cell in the first direction, the plurality of first signal lines being arranged in the second direction, and the plurality of first signal lines being electrically connected to the standard cell;

first and second power lines extending on the first level on the standard cell in the first direction, the first and second power lines being connected to the one or more of plurality of contact structures, and the first and second power lines being arranged parallel to the plurality of first signal lines;

a plurality of second signal lines extending on a second level, higher than the first level, on the standard cell in the second direction, and the plurality of second signal lines being arranged in the first direction, one or more of the plurality of second signal lines including first and second power supply lines respectively connected to the first and second power lines;

a plurality of third signal lines extending on a third level, higher than the second level, on the standard cell in the first direction, and the plurality of third signal lines being arranged in the second direction; and a first power strap and a second power strap extending on the third level on the standard cell in the first direction, respectively connected to the first and second power supply lines, and each arranged on a same row as one of the plurality of third signal lines, while spaced from each other in the first direction.

12. The semiconductor device of claim 11, wherein a first width of each of the first and second power lines is larger than a second width of each of the first and second power straps.

13. The semiconductor device of claim 11, wherein a first width of each of the first and second power straps is equal to a second width of the one of the plurality of third signal lines.

14. The semiconductor device of claim 11, wherein none of the first and second power supply lines is directly connected to either the plurality of first signal lines or the plurality of third signal lines.

15. The semiconductor device of claim 11, wherein a first width of each of the first and second power lines is larger than a second width of each of the plurality of first signal lines, and the first and second power lines and the plurality of first signal lines are arranged on the first level by a same interval in the second direction.

16. The semiconductor device of claim 15, wherein the plurality of third signal lines are arranged by the same interval in the second direction.

17. The semiconductor device of claim 11, wherein at least one of the plurality of third signal lines is provided not to overlap or to partially overlap the plurality of first signal lines.

18. The semiconductor device of claim 11, wherein the first power strap is provided on a first boundary of the standard cell in the first direction, and the second power strap is provided in a region in the standard cell, adjacent to a second boundary positioned opposite to the first boundary.

19. A semiconductor device comprising:

a plurality of active patterns extending in a first direction, the plurality of active patterns being spaced apart from each other in a second direction different from the first direction;

a gate structure intersecting the plurality of active patterns and extending in the second direction, and a source region provided a first side of the gate structure and a drain region provided on a second side of the gate structure;

a plurality of signal lines extending in the first direction on a first level;

a first power strap extending on the first level in the first direction on a same row as a first signal line, among the plurality of signal lines, the first power strap configured as a power tap electrically connected to one of the source region or the drain region; and a first power line extending in the first direction on a second level, below the first level, the first power line overlapping the first power strap in a third direction perpendicular to the first direction, wherein the first power strap has a first width equal to a second width of the one of the plurality of signal lines and less than a third width of the first power line, and wherein one or more of the plurality of signal lines are provided between the first power strap and the second power strap in the second direction.

* * * * *